United States Patent [19]

Shou et al.

[11] Patent Number: 5,617,053

[45] Date of Patent: *Apr. 1, 1997

[54] COMPUTATIONAL CIRCUIT

[75] Inventors: Guoliang Shou; Sunao Takatori; Makoto Yamamoto, all of Tokyo, Japan

[73] Assignees: Yozan, Inc., Tokyo; Sharp Corporation, Osaka, both of Japan

[*] Notice: The term of this patent shall not extend beyond the expiration date of Pat. No. 5,465,064.

[21] Appl. No.: 468,762

[22] Filed: Jun. 6, 1995

Related U.S. Application Data

[62] Division of Ser. No. 262,759, Jun. 20, 1994, abandoned.

[30] Foreign Application Priority Data

| Jun. 17, 1993 | [JP] | Japan | 5-171041 |
| Jun. 18, 1993 | [JP] | Japan | 5-172551 |
| Jun. 18, 1993 | [JP] | Japan | 5-172552 |
| Jun. 19, 1993 | [JP] | Japan | 5-174713 |
| Jun. 24, 1993 | [JP] | Japan | 5-177362 |
| Jun. 30, 1993 | [JP] | Japan | 5-187215 |
| Sep. 20, 1993 | [JP] | Japan | 5-256355 |
| Sep. 20, 1993 | [JP] | Japan | 5-256359 |
| Sep. 20, 1993 | [JP] | Japan | 5-256367 |
| Sep. 20, 1993 | [JP] | Japan | 5-256518 |
| Sep. 20, 1993 | [JP] | Japan | 5-256557 |
| Sep. 20, 1993 | [JP] | Japan | 5-256558 |
| Apr. 1, 1994  | [JP] | Japan | 6-087720 |

[51] Int. Cl.[6] .............................. G06G 7/14; G06G 7/16
[52] U.S. Cl. .................................... 327/361; 327/356
[58] Field of Search ........................ 327/355, 356, 327/358, 361, 363, 91, 94, 96

[56] References Cited

U.S. PATENT DOCUMENTS

| 3,013,209 | 12/1961 | Bickel . | |
| 3,508,073 | 4/1970 | Everly | 327/361 |
| 3,521,041 | 7/1970 | Blerkom | 327/552 |
| 3,610,910 | 10/1971 | Udall | 327/356 |
| 3,744,623 | 1/1973 | Mickler | 307/238 |
| 3,789,371 | 1/1974 | Markowitz | 307/238 |
| 3,812,478 | 5/1974 | Tomisawa . | |
| 3,882,402 | 5/1975 | Jensen | 328/165 |
| 3,912,917 | 10/1975 | Nussbaumer | 327/552 |
| 4,016,410 | 4/1977 | Eggermont | 327/552 |
| 4,546,324 | 10/1985 | Bingham | 327/91 |
| 4,616,185 | 10/1986 | Van Roermund | 327/355 |
| 4,703,251 | 10/1987 | Baumgartner | 327/269 |
| 4,716,375 | 12/1987 | Van Roermund | 327/356 |
| 4,734,599 | 3/1988 | Bohac, Jr. | 327/356 |
| 4,760,346 | 7/1988 | Kultgen | 330/69 |
| 5,081,372 | 1/1992 | Pelgrom | 327/95 |
| 5,254,889 | 10/1993 | Han | 307/529 |

(List continued on next page.)

OTHER PUBLICATIONS

Roper, K.W., "Application Lab Report 619, 2N598 Transistor Kirchhoff Adders", Philco Corporation, Lansdale Division (1962).

Massara, Robert E., "Synthesis of Low–Pass Forms", Active Filters, The Electrical Engineering Handbook, 1993, pp. 674–691.

*Primary Examiner*—Timothy P. Callahan
*Assistant Examiner*—T. Lam
*Attorney, Agent, or Firm*—Cushman, Darby & Cushman IP Group of Pillsbury Madison & Sutro LLP

[57] ABSTRACT

A computational circuit that includes a first capacitive coupling that connects a plurality of analog input voltages to a first inverter. The first inverter is connected to a second inverter through a connecting capacitance. A first feedback capacitance connects the output of the first inverter to its input, and a second feedback capacitance connects the output of the second inverter to its input. A first additional capacitance is operatively connected between ground and the first capacitive coupling, and a second additional capacitance is connected between ground and the connecting capacitance. The values of the first and second additional capacitances is selected such that the closed-loop gains of the first and second inverters are substantially equal.

3 Claims, 28 Drawing Sheets

U.S. PATENT DOCUMENTS

| | | | |
|---|---|---|---|
| 5,262,686 | 11/1993 | Kurosawa | 327/77 |
| 5,287,108 | 2/1994 | Mayes | 341/156 |
| 5,302,869 | 4/1994 | Hosotani et al. | 327/75 |
| 5,305,250 | 4/1994 | Salam | 327/361 |
| 5,311,087 | 5/1994 | Suganuma | 327/551 |
| 5,378,932 | 1/1995 | Shin | 327/333 |
| 5,388,063 | 2/1995 | Takatori | 364/724.17 |
| 5,396,446 | 3/1995 | Shou | 364/825 |
| 5,408,142 | 4/1995 | Takatori et al. | 327/91 |
| 5,408,422 | 4/1995 | Takatori et al. | 327/356 |
| 5,410,192 | 4/1995 | Yamada | 327/408 |
| 5,412,263 | 5/1995 | Nagaraj | 327/566 |
| 5,414,311 | 5/1995 | Carley | 327/94 |
| 5,416,370 | 5/1995 | Takatori et al. | 327/356 |
| 5,416,439 | 5/1995 | Shou et al. | 327/356 |
| 5,440,605 | 8/1995 | Shou et al. | 327/355 |
| 5,444,411 | 8/1995 | Yang | 327/361 |
| 5,453,711 | 9/1995 | Yamamoto | 327/355 |
| 5,457,417 | 10/1995 | Shou et al. | 327/356 |
| 5,465,064 | 11/1995 | Shou et al. | 327/361 |
| 5,469,102 | 11/1995 | Shou et al. | 327/361 |

| x | y | A | B | C | D |
|---|---|---|---|---|---|
| 0 | 0 | 1 | 0 | 0 | 0 |
| 1 | 0 | 0 | 1 | 0 | 0 |
| 0 | 1 | 0 | 0 | 1 | 0 |
| 1 | 1 | 0 | 0 | 0 | 1 |

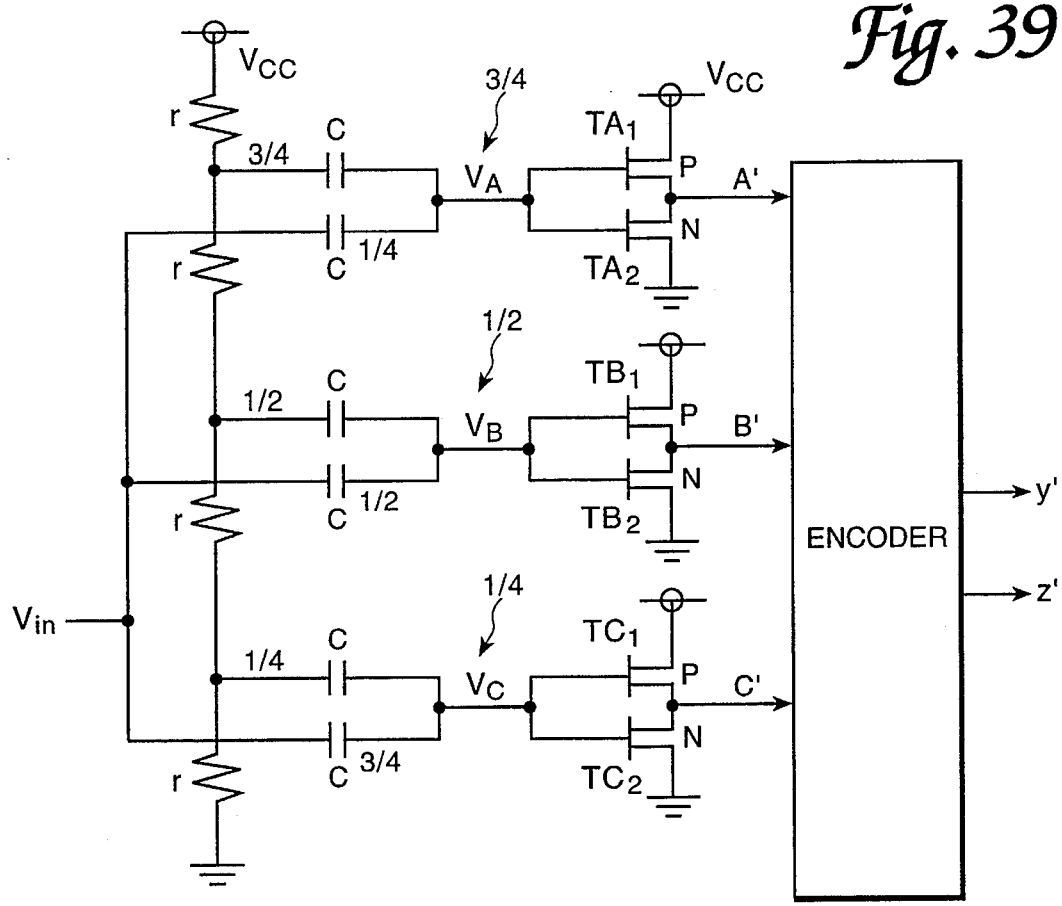
Fig. 39
Fig. 40
| A' | B' | C' | Y' | Z' |
|---|---|---|---|---|
| 1 | 1 | 1 | 0 | 0 |
| 0 | 1 | 1 | 1 | 0 |
| 0 | 0 | 1 | 0 | 1 |
| 0 | 0 | 0 | 1 | 1 |
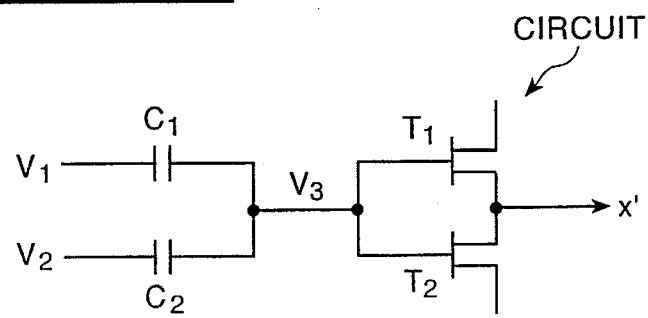
Fig. 41

5,617,053

COMPUTATIONAL CIRCUIT

This is a division of application Ser. No. 08/262,759, filed Jun. 20, 1994, now abandoned.

BACKGROUND OF THE INVENTION

1. Field of the Invention

The present invention relates to a computational circuit for performing a computation using analog data.

2. Description of the Related Art

Conventional computers are of a digital type, and computations are performed by means of many combinations of simple digital logic circuits. Digital computation is advantageous in that it provides good accuracy and redundancy, but its limitations have begun to appear in the form of large equipment costs for precise manufacturing processes. Analog computation was frequently applied to solve differential equations, but has made little technological progress beyond this. Because of the limitations noted above, the analog computation is now attracting attention again. Operational amplifiers are used in conventional analog computation. However, large amount of electric power is necessary for large scale computation because it is driven by current. As a resulot, it is difficult to provide a practical circuit for a large scale, complicated calculation.

SUMMARY OF THE INVENTION

It is an object of the present invention to provide an analog computational circuit capable of performing a large scale and complicated computation.

According to the present invention, various performing circuits are proposed in which addition is performed by a capacitive coupling and multiplication is performed by the weighting of the capacitive coupling.

Multiplication is also performed by using a logarithmic calculation type circuit for transforming a voltage into time length, which is also useful for exponential calculation.

BRIEF DESCRIPTION OF THE DRAWINGS

FIG. 39 is a converter circuit for converting a multi-valued number to a binary number;

FIG. 40 shows signal levels; and

FIG. 41 shows a circuit for switching.

DETAILED DESCRIPTION OF THE PRESENTLY PREFERRED EXEMPLARY EMBODIMENTS

Hereinafter, an embodiment of a weighted addition circuit of the present invention is described with reference to the attached drawings.

Figure 1:
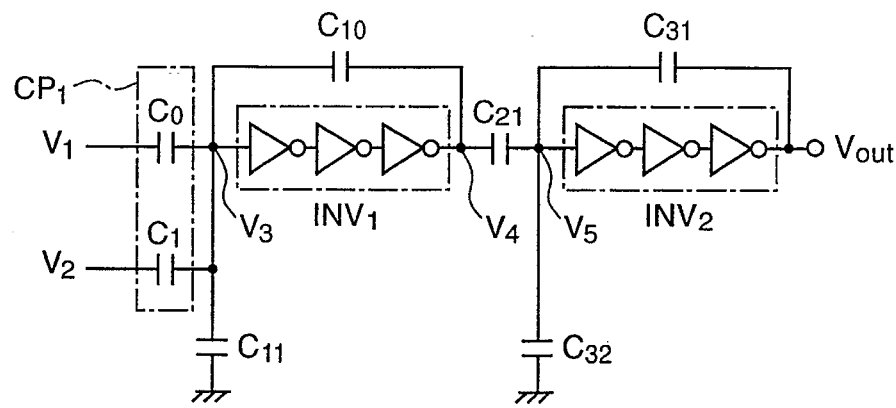
FIG. 1 is a circuit diagram of a first embodiment according to the present invention for weighted addition.

In FIG. 1, the first embodiment of a weighted addition circuit consists of a capacitive coupling CP1 and inverters INV1 and INV2 connected in series. CP1 has capacitances C0 and C1 connected in parallel.

An output of INV1 is fed back to its input through capacitance C10 and output to INV2 through capacitance C21. An output of INV2 is fed back to its input through capacitance C31. Furthermore, additional capacitances C1 and C32 are parallelly connected to CP1 and C21.

In CP1, input voltages V1 and V2 are input to capacitances C0 and C1, respectively.

Assuming that offset voltages generated at the input side of INV1 and INV2 are equal to each other, the voltage value is defined as Voff. Input and output voltages of INV1 are defined as V3 and V4, and an input voltage of INV2 is defied as V5. Then, formula 1 is defined.

$$(C0V1+C1V1+C10V4)/(C0+C1+C10-C11)=V3 \quad (1)$$

By formula 1, formulas 2 and 3 are obtained.

$$V4=\{V3(C0+C1+C10-C11)-(C0V1+C1V2)\}/C10 \quad (2)$$

$$(C21V4+C31Vout)/(C21+C31-C32)=V5 \quad (3)$$

By formula 3, formula 4 is obtained.

$$Vout=\{V5(C21+C31-C32)-(C21V4)\}/C31 \quad (4)$$

Formula 2 is substituted to formula 4, and formula 5 is obtained.

$$Vout = V5(C21 + C31 - C32)/C31 - \quad (5)$$
$$V3C21(C0 + C1 + C10 - C11)/C10C31 -$$
$$(C0V1 + C1V2)C21/C10C31$$

If V1=V2=0, then V3=V5=Voff, and formula 6 is established.

$$Vout = Voff(C21 + C31 - C32)/C31 - \quad (6)$$
$$VoffC21(C0 + C1 + c10 - C11)/C10C31$$

If offset is canceled, Vout=0. The right side of formula 6 becomes 0.

$$(C21 + C31 - C32)C10 = \quad (7)$$
$$(C0 + C1 + C10 - C11)C21 \therefore (C21 +$$
$$C31 - C32)/C21 = (C0 + C1 + C10 - C11)/C10$$

Formula 7 demonstrates that closed loop gains of INV1 and INV2 are equal. If C11 and C32 do not exist, then formula 7 is changed to the formula 8. The allowable capacitance range of C0, C1, C10, C21 and C31 are narrowly limited.

$$C32/C21=(C0+C1)/C10 \quad (8)$$

That is, the allowable range of C0, C1, C10, C21 and C32 is extended.

Figure 2:
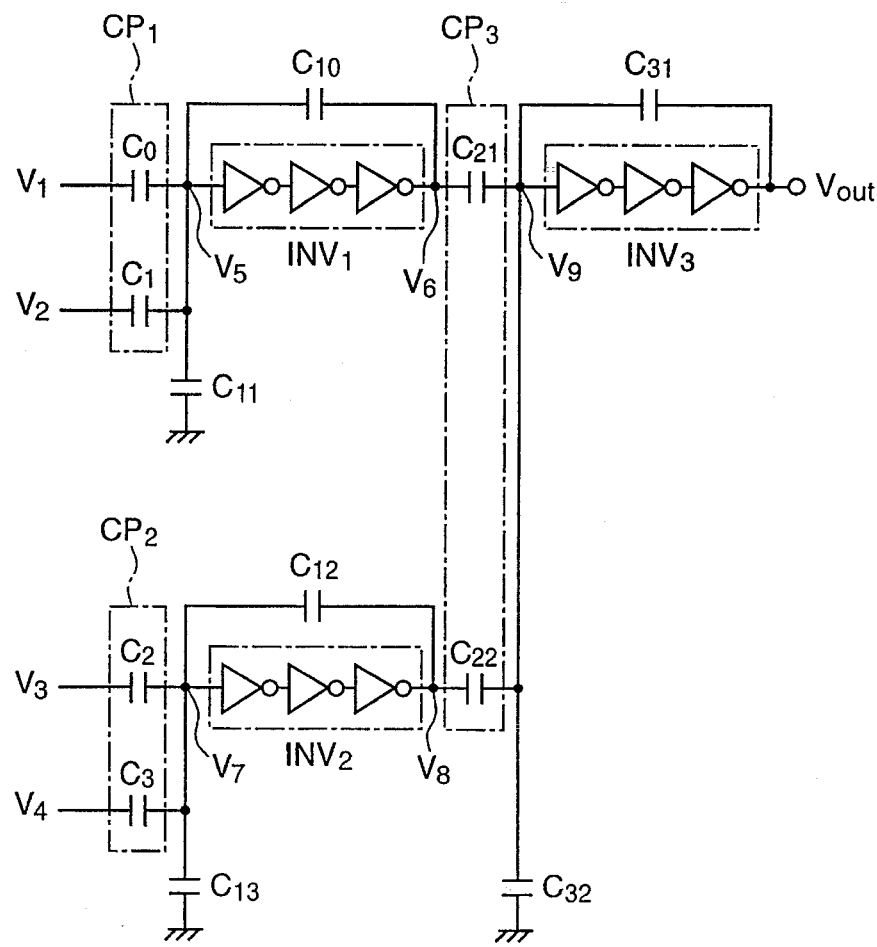
FIG. 2 is a second embodiment of the weighted addition circuit.

FIG. 2 shows a second embodiment, which includes the first and second capacitive couplings CP1 and CP2 for input voltages V1 to V4. V1 and V2 are added by CP1 and input to INV1. V3 and V4 are added by CP2 and input to INV2. These circuits are similar to the circuit of CP1 and INV1 in FIG. 1. The outputs of INV1 and INV2 are added by a capacitive coupling CP3 and input to INV2. Outputs of inverters INV1, INV2 and INV3 are fed back to their input through capacitances C10, C12 and C31, and CP1, CP2 and CP3 are connected to ground through additional capacitances C11, C13 and C32.

In CP1 and CP2, input voltages V1, V2, V3 and V4 are input to capacitances C0, C1, C2 and C3. The following formulas are obtained defining input voltages of INV1, INV2 and INV3 as V5, V7 and V9 and output voltages as V6, V8 and Vout, respectively.

$$V6 = \frac{V5(C0 + C1 + C10 - C11) - C0V1 - C1V2}{C10} \quad (9)$$

$$V8 = \frac{V7(C2 + C3 + C12 - C13) - C2V3 - C3V4}{C12} \quad (10)$$

These two formulas are substituted into formula 11.

$$C21V6+C22V6+C31Vout+V9(C32-C21-C22-C31)=0 \quad (11)$$

By substituting (9) and (10) into (11), formula 12 is obtained.

$$Vout = V9(C21 + C22 + C31 - C32)/C31 - \quad (12)$$
$$C21\{V5(C0 + C1 + C10 - C11) - (C0V1 +$$
$$C1V2)\}/C10C31 - C22\{V7(C2 + C3 + C12 -$$
$$C13) - (C2V3 + C3V4)\}/C12C31$$

Similar to the circuit of FIG. 1, when V1=V2=V3=V4=0, V5=V7=V9=Voff, and formula 13 is obtained.

$$Vout = Voff(C21 + C22 + C31 - C32)/C31 - \quad (13)$$
$$Voff(C0 + C1 + C10 - C11)C21/C10C31 -$$
$$Voff(C2 + C3 + C12 - C13)C22/C12C31$$

If the offset is canceled, Vout=0, the right side of formula 12 becomes 0.

$$(C21 + C22 + C31 - C32)/C31 = \quad (14)$$
$$(C21/C31)(C0 + C1 + C10 - C11)/C10 +$$
$$(C22/C31)(C2 + C3 + C12 - C13)/C12$$

Formula 14 demonstrates that a weighted addition of loop gains of INV1 and INV2 are equal to a closed loop gain of INV3. Additional capacitances C11, C13 and C32 are effective for flexible determination in design of capacitances C0, C1, C2, C3, C10, C12, C21, C22 and C31.

Hereinafter, an embodiment of a multiplication circuit by a weighted addition circuit is described.

Figure 3:
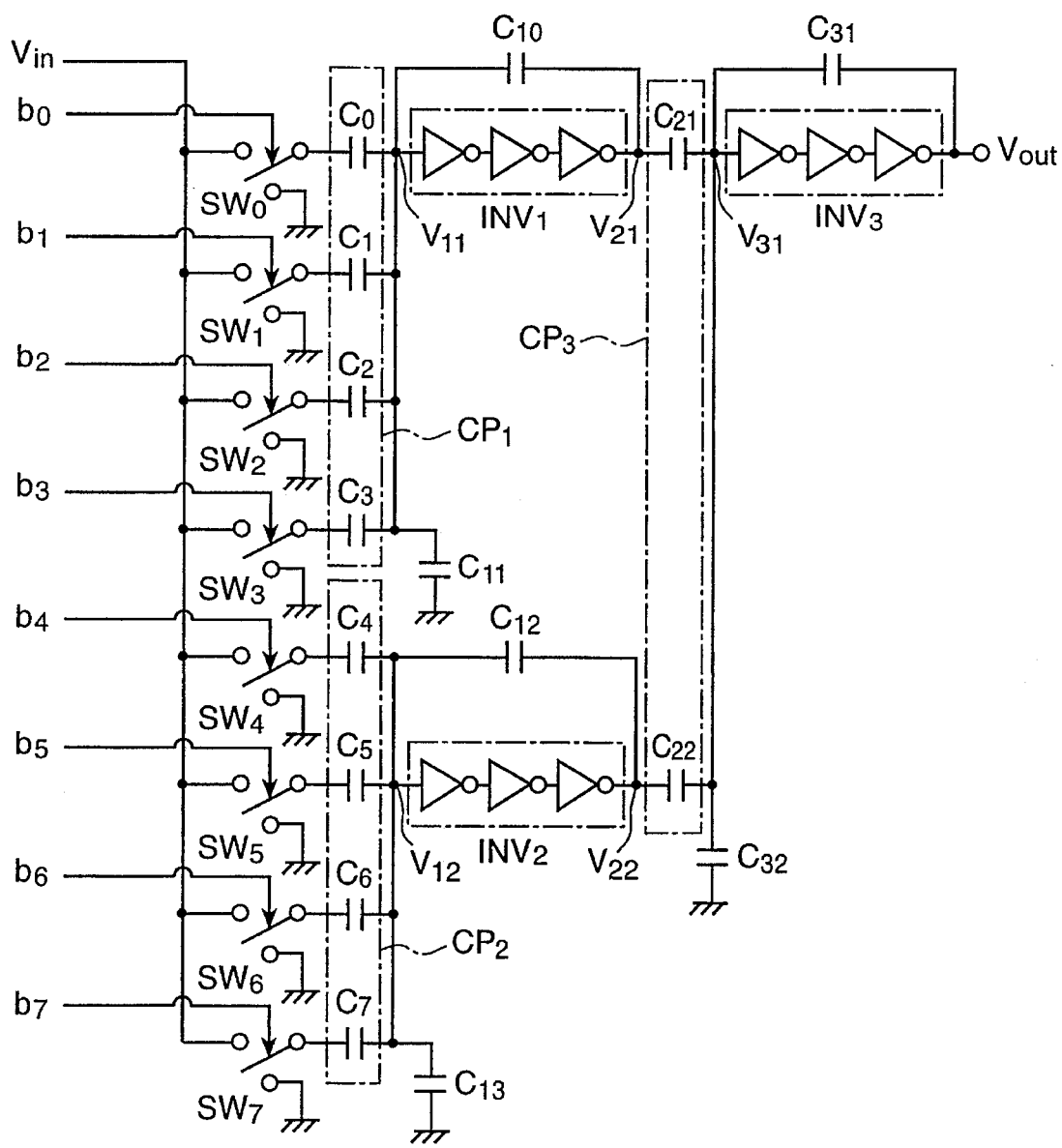
FIG. 3 is a multiplication circuit using the addition circuit in FIG. 2.

In FIG. 3, the first embodiment of a multiplication circuit is comprised of switching means SW0 to SW7 to which analog data Vin is input, and these switching means are controlled by each bit b0 to b7 of digital data.

The switching means are classified into two groups. The first group G1 includes SW0 to SW3, and the second group G2 includes SW4 to SW7. Each group is integrated by capacitive couplings CP1 and CP2.

Capacitive coupling CP1 is composed of capacitances C0 to C3, and CP2 is composed of capacitances C4 to C7. C0 to C3 have capacities in proportion to weights b0 to b3, and C4 to C7 have capacities in proportion to weights b4 to b7. Furthermore, CP1 and CP2 are grounded through capacitances C11 and C13.

Outputs of capacitances CP1 and CP2 are input to inverters INV1 and INV2, and outputs of each of the inverters INV1 and INV2 are united by capacitive coupling CP3. An output of CP3 is output as output analog data Vout through inverter INV3, and CP3 is grounded through capacitance C32.

Inverters INV1 to INV3 are serially connected in three stages so that an accuracy of each inverter is guaranteed. In each inverter, its output is fed back through C10, C12 or C31 to its input, and its capacity is arranged according to the formulas 15, 16 and 17.

$$C10-C11=C0+C1+C2+C3 \quad (15)$$

$$C12-C13=C4+C5+C6+C7 \quad (16)$$

$$C31 + C32 = C21 + C22 \tag{17}$$

When INV1 to INV3 have a gain of G, the impressed voltages on C0 to C7 are V0 to V7, input voltages of INV1 and INV2 are Vii and V12, output voltages of INV1 and INV2 are V21 and V22 and an output of INV3 is V31, then the following formulas are obtained.

$$\sum_{i=1}^{3} Ci(Vi - V11) + C10(V11 - V21) + C11 V11 = 0 \tag{18}$$

$$\sum_{i=4}^{7} (Vi - V12) + C12(V12 - V22) + C12 V12 = 0 \tag{19}$$

$$C21V21 + C22V22 + C31(V31 - Vout) + C32V31 = 0 \tag{20}$$

$$V21 = GV11, \; V22 = GV12 \text{ and } Vout = GV31 \tag{21}$$

Approximately, $$V21 = \sum_{i=0}^{3} CiVi/C10 \tag{22}$$

and $$V22 = \sum_{i=4}^{7} CiVi/C12 \tag{23}$$

so that $$Vout = (C21V21 + C22V22)/C31 \tag{24}$$

If switch SWi is connected to Vin or ground, depending on the state of b0 to b7, then Vi=Vin or 0, and the following formulas are established.

$$Ci = 2^i \times Cu \; (i=0 \text{ to } 3) \tag{25}$$

$$Ci = 2^{i-4} \times Cu \; (i=4 \text{ to } 7) \tag{26}$$

$$C11 = C13 = C32 = Cu \tag{27}$$

Cu is unit of capacitance.

$$C22 = 2^4 \times C21 \tag{28}$$

$$C31 = 2^4 \times Cu \tag{29}$$

Therefore, the final output is a multiplication, the result of analog data and digital data as follows.

$$Vout = \sum_{i=0}^{7} 2^i bi Vin/2^8 \tag{30}$$

If $$C31 = 2^3 \times Cu \tag{31}$$

is established, then formula 32 is obtained, and the final output is twice that of formula 30.

$$Vout = \sum_{i=0}^{7} 2^i bi Vin/2^7 \tag{32}$$

By such level control, the working range becomes selectable.

As shown by formula 26, bit weights as multipliers are classified into two groups of b0 to b3 and b4 to b7. The addition results of the two groups are further added. In each multiplication of two stages, each capacitance is decreased in capacity range, less than $2^3$.

As mentioned above, the closed loop gains of the first and the second inverters are substantially equal to each other, and capacitive couplings of the inverters are connected through additional capacitances to the ground so that the gains are balanced. Then, the embodiment minimizes the influences of a bias voltage.

Figure 4:
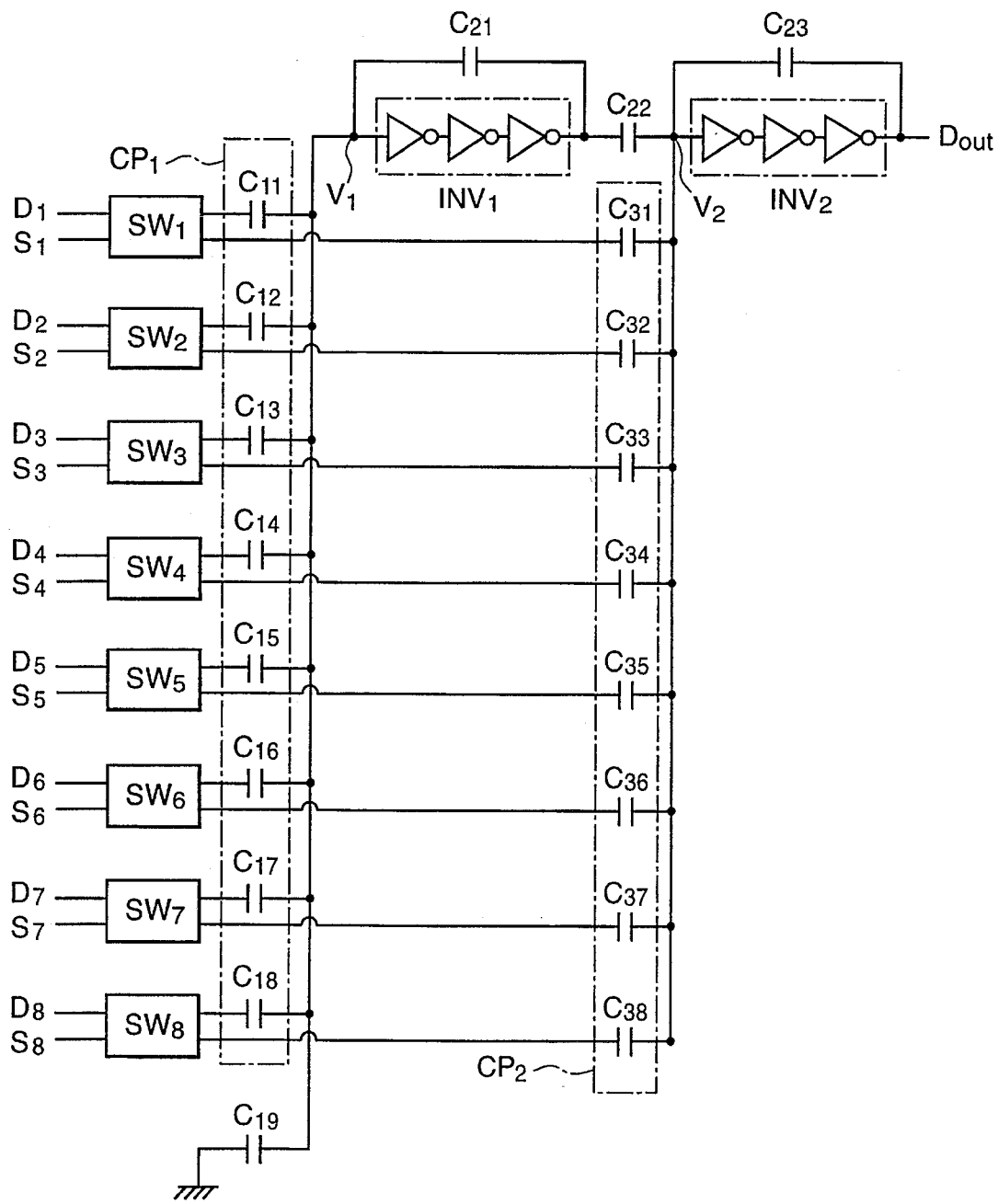
FIG. 4 illustrates a third embodiment of the weighted addition circuit.

In FIG. 4, the third embodiment of the addition circuit comprises of two serially connected inverters INV1 and INV2, and an output of INV1 is connected to INV2 through a capacitance C22. The output of INV1 is fed back to INV1 through capacitance C21, and an output of INV2 is fed back to its input through capacitance C23. INV1 and INV2 guarantee an accuracy of an output and its linear characteristics by their sufficiently large gain and the feedback circuit.

A capacitive coupling CP1 is connected to an input of INV1 with a plurality of capacitances C11 to C18 being parallelly connected. A capacitive coupling CP2 is connected to an input of INV2 with a plurality of capacitances C31 to C38 being parallelly connected. The capacitive couplings CP1 and CP2 have corresponding capacitances C1i and C3i which are connected to an output of common switching means SWi. An input voltage Di and a sign signal Si showing whether the input data is plus or minus are input to SWi. A voltage value of Di is always plus, and it shows an absolute value of the input data.

Switching means SWi is switched by sign signal Si. When the sign is plus, then Di is input to INV1 from CP1, and Di is input to INV2 from CP2 when minus. SWi alternatively connects capacitances C1i or C3i, to which Di is not connected to the ground (see FIG. 5). Here, Si is a binary signal of 0 and 1. When Di is positive, Si is equal to 0. When Di is negative, Si is equal to 1. Input voltages V1 and V2 corresponding to INV1 and INV2 are calculated as follows.

$$V1 = -\sum_{i=1}^{8} DiSiC1i/CT1 \tag{33}$$

where $$CT1 = \sum_{i=1}^{9} C1i \tag{34}$$

and $$V2 = \sum_{i=1}^{8} \{DiSiC3i - C22V1(CT1/C21)\}CT2 \tag{35}$$

where $$CT2 = \sum_{i=1}^{9} C3i + C22 \tag{36}$$

If the following conditions are established, C19=C21= C22=C23=16C11, and C1i=C3i= a constant, then, the following condition is obtained.

$$V2 = \left( -\sum_{i=1}^{8} DiSiC1i + \sum_{i=1}^{8} DiSiC3i \right)/24 \tag{37}$$

Therefore, the output Dout of INV2 is calculated as below.

$$\begin{aligned} Dout &= -(CT2/C23)V2 \\ &= \left( \sum_{i=1}^{8} DiSi - \sum_{i=1}^{8} DiSi \right)/16 \end{aligned} \tag{38}$$

This formula demonstrates that a normalized signed addition circuit results.

Figure 5:
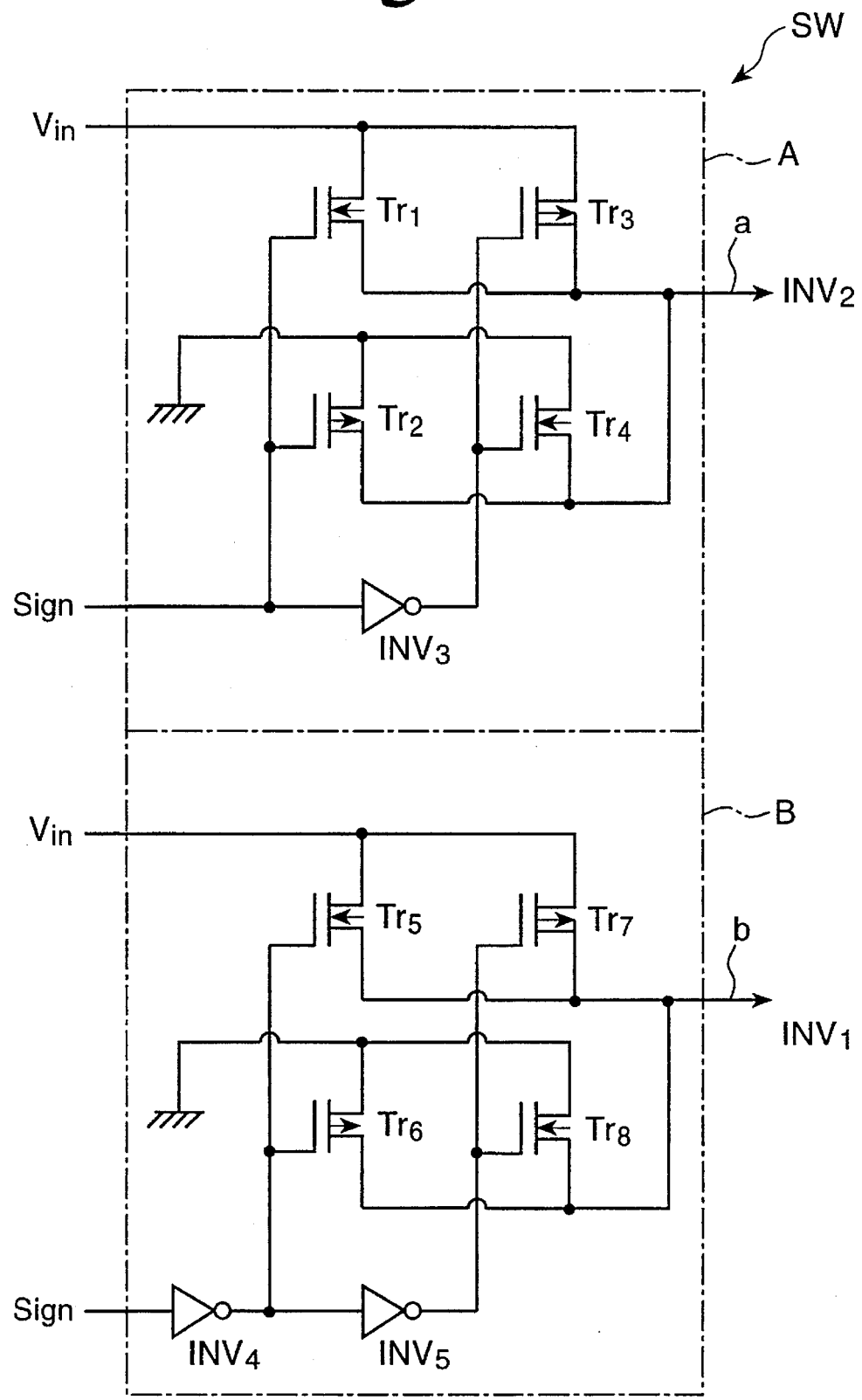
FIG. 5 shows a switching means of the third embodiment in FIG. 4.

FIG. 5 is a circuit diagram of switching means SW of the third embodiment, and it is composed by toggle means A and B.

Toggle means A is composed of transistors Tr1 to Tr4 and INV3. Voltage Vin is input to the drains of Tr1 and Tr3, and the sources of Tr1 and Tr3 are connected to an output terminal a. Sign signal Sign is input to a gate of Tr1 and to a gate of Tr3 through INV3. The sources of Tr2 and Tr4 are grounded, and the drains of Tr2 and Tr4 are connected to the output terminal a. Sign signal Sign is input to a gate of Tr2 and through INV4 to a gate of Tr4.

Toggle means B is composed of transistors Tr5 to Tr8 and INV4 and INV5.

Voltage Vin is input to the drains of Tr5 and Tr7, and the sources of Tr5 and Tr7 are connected to an output terminal b. Sign signal Sign is input to a gate of Tr5 through INV4, and sign signal Sign is input to the gates of Tr7 through INV4 and INV5. Sources of Tr6 and Tr8 are grounded, and drains of Tr6 and Tr8 are connected to the output terminal b. Sign signal is input through INV4 to a gate of Tr6 and through INV4 and INV5 to a gate of Tr8.

When sign signal Sign is equal to 1, Tr1 and Tr3 of toggle means A are conductive, and voltage Vin is output to output terminal a. The voltage is then input to INV2. At toggle means B, Tr6 and Tr8 are conductive, and output terminal b is grounded so that it has a voltage of 0 V.

Contrary to the above, when sign signal Sign is equal to 0, the output terminal a of toggle means A is grounded to have a voltage of 0V. At the output terminal b of toggle means B, Vin is output and it is input to INV1.

The addition circuit described above guarantees an output accuracy by serially connecting 2 stages of inverters including a feed back circuit, and it is possible to execute an addition of signed analog data because data is input to the first stage or the second stage inverter corresponding to the positive/negative signs of data.

Hereinafter, an embodiment of a multiplication circuit is described referring to the attached drawings.

Figure 6:
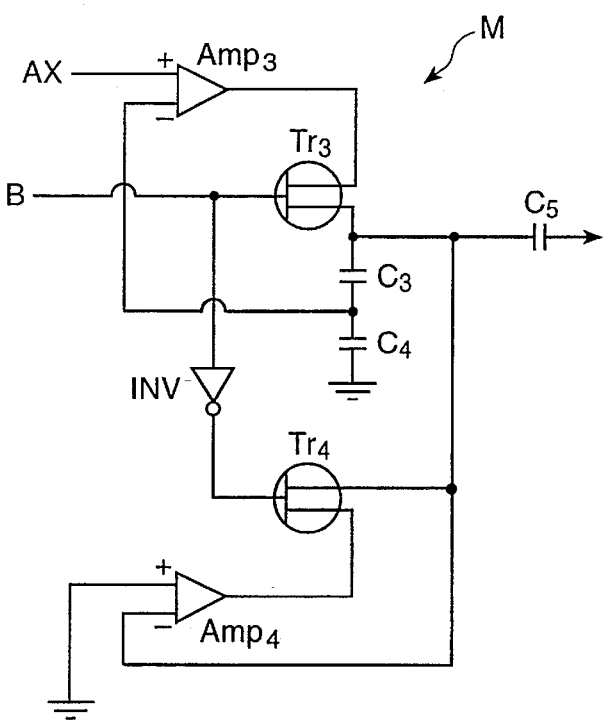
FIG. 6 illustrates a second embodiment of the multiplication circuit.

In FIG. 6, the second embodiment of multiplication circuit M comprises a pair of operational amplifiers Amp3 and Amp4 and a pair of field effect transistors Tr3 and Tr4. Analog input data AX is input to the non-inverted input of AMP3. An output of Amp3 is connected to a drain of Tr3, and a source of Tr3 is grounded through capacitances C3 and C4. A voltage between C3 and C4 is fed back to a non-inverted input of Amp3. Tr3 is conductive when digital input B is input to the gate and B is at a high level. At that time, an output of Amp3 is controlled for impressing a voltage equal to AX to C4, and an electrical charge is stored at C4 for generating a charged voltage equal to AX. A source voltage of Tr3 is shown by the following formula.

$$AX\{(C3-C4)/C3\}$$

In Amp4, a non-inverted input is grounded, and the output is connected to a source of Tr4. A drain of Tr4 is connected to C3, and it is fed back to a non-inverted input of Amp4. Digital data B, inverted by inverter INV, is input to a gate of Tr4, and Tr4 is conductive when B is at a low level. At the same time, an output of Amp4 is controlled to generate 0 V at a drain of Tr4.

A source of Tr3 and a drain of Tr4 are connected to capacitance C5 for outputting, which outputs a weighted output by a weight determined by a capacitive coupling including C5. That is, M corresponding to AX is shown by $\{(C3-C4)/C3\}Cpp$ where Cpp is a weight predetermined by a capacitive coupling. Stated another way, a multiplication with a multiplier "0" as a multiplier is performed.

Figure 9:
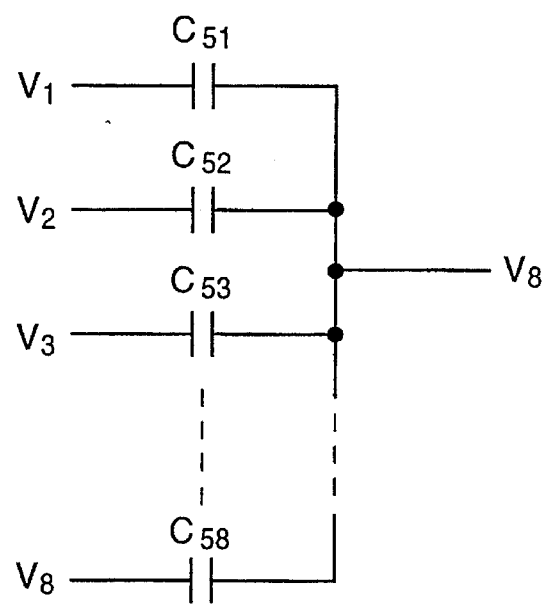
FIG. 9 is an embodiment of a capacitive coupling circuit for an addition circuit in FIG. 7.

A capacitive coupling circuit is a circuit having a plurality of capacitances (8 capacitances C51 to C58), which are commonly connected to one output, as shown in FIG. 9. When voltages V1 to V8 are impressed to these capacitances, the output voltage V8 is shown by the following formula, and weighted addition is performed.

$$V8=(C51V1+C52V2+\ldots+C58V8)/(C1+C2+\ldots+C8) \quad (39)$$

A plurality of circuits, as shown in FIG. 6, are parallelly connected for multiplying analog data directly by digital data, in which $\{(C3-C4)/C3\}Ccp$ is defined as $2^n$.

Figure 7:
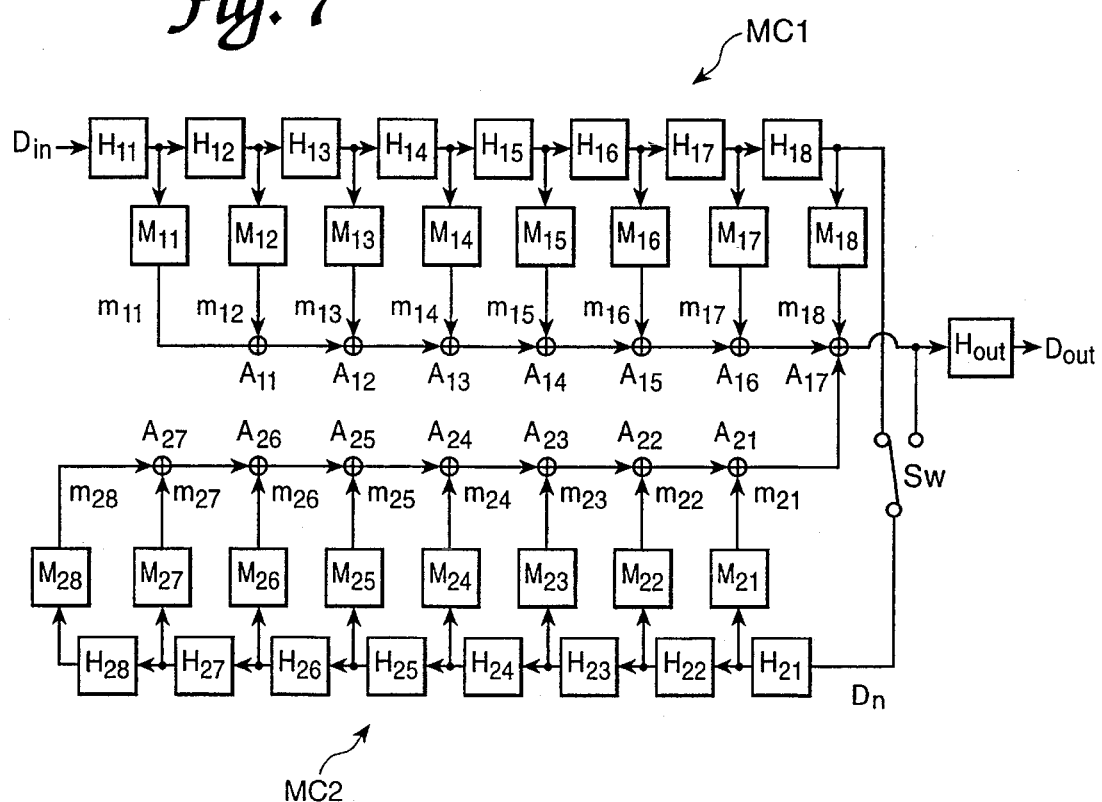
FIG. 7 is a filter circuit using the multiplication circuit in FIG. 6.

The multiplication circuit mentioned above can be applied to various usages. The filter circuit shown in FIG. 7 is one possible application. In FIG. 7, multiplication circuits are shown by M11 to M18 and M21 to M28.

In FIG. 7, the filter circuit has a first addition and multiplication circuit MC1 and a second addition and multiplication circuit MC2. The first circuit MC1 includes a plurality of hold circuits H11 to H18 connected in series, and an output of each hold circuit H1k is input to a multiplication circuit. The second circuit MC2 includes a plurality of hold circuits H21 to H28 connected in series, and the output of each hold circuit H2k is input to a multiplication circuit M2k.

The first addition and multiplication circuit receives input data Din, and Din is held once at each hold circuit and transferred to the next hold circuit. Then, at each hold circuit, sequential data of Din is held. The sequential data is expressed as X(t-k). At each multiplication circuit M11 to M18, the predetermined multipliers a1 to a8 are input beforehand, and the circuit executes multiplication for the sequential data, as below defined.

$$m1k=ak \times X(t-k) \quad (40)$$

m1k is a multiplication result of multiplication circuit M1k.

The outputs of multiplication circuits M1k and M1(k+1) are added by addition circuit A1k, and the addition result is output to the next addition circuit A1(k+1). Therefore, addition circuit A17 calculates a total summation of outputs of all multiplication circuits in the first addition and multiplication circuit according to the following formula.

$$\sum_{i=1}^{8} ak \times X(t-k) \quad (41)$$

The output of A17 or H18 are input to the second addition and multiplication circuit, as the second input data Dm, and Dm is held once at each hold circuit H21 to H28 and transferred to the next hold circuit. Sequential data of Dm is kept at each hold circuit. In each multiplication circuit M21 to M28, the predetermined multipliers b1 to b8 are input, and multiplication is executed for the sequential data.

$$m2k=bk \times Y(t-k)$$

m2k is a multiplication result of multiplication circuit M2k.

Outputs of multiplication circuits M2k and M2(k+1) are added by addition circuit A2k, and an addition result is output to the next addition circuit A2(k-1). Therefore, addition circuit A27 calculates a total summation of outputs of all multiplication circuits in the second addition and multiplication circuit according to the following formula.

$$\sum_{i=1}^{8} bk \times Y(t-k)$$

An output of addition circuit A21 is input to addition circuit A17 in the first addition and multiplication circuit MC1, and an output of A17 represents a total of multiplication result of both MC1 and MC2.

When SW is connected to H18, Dm becomes x(t−8) and an output of MC2 is shown by the following formula.

$$\sum_{i=1}^{8} bk \times X(t-k-8)$$

By defining bk=a(k+8), a total of MC1 and MC2 output from A17 is shown by the following formula, and FIR type filter characteristic is realized.

$$\sum_{i=1}^{16} ak \times X(t-k) \quad (42)$$

When SW is connected to A17, the following formulas are obtained.

$$Dm = \sum_{i=1}^{8} ak \times X(t-k) + \sum_{i=1}^{8} bk \times Y(t-k) \quad (43)$$

$$Y(t)=Dm \quad (44)$$

These formulas demonstrate that IIR type characteristics are obtained.

As mentioned above, by switching SW, both FIR and IIR type filters are realized. When realizing a FIR type filter, a comparatively large number of stages using total hold circuits and multiplication circuits are employed. Also, filter with wide usage and high speed is obtained.

Figure 8:
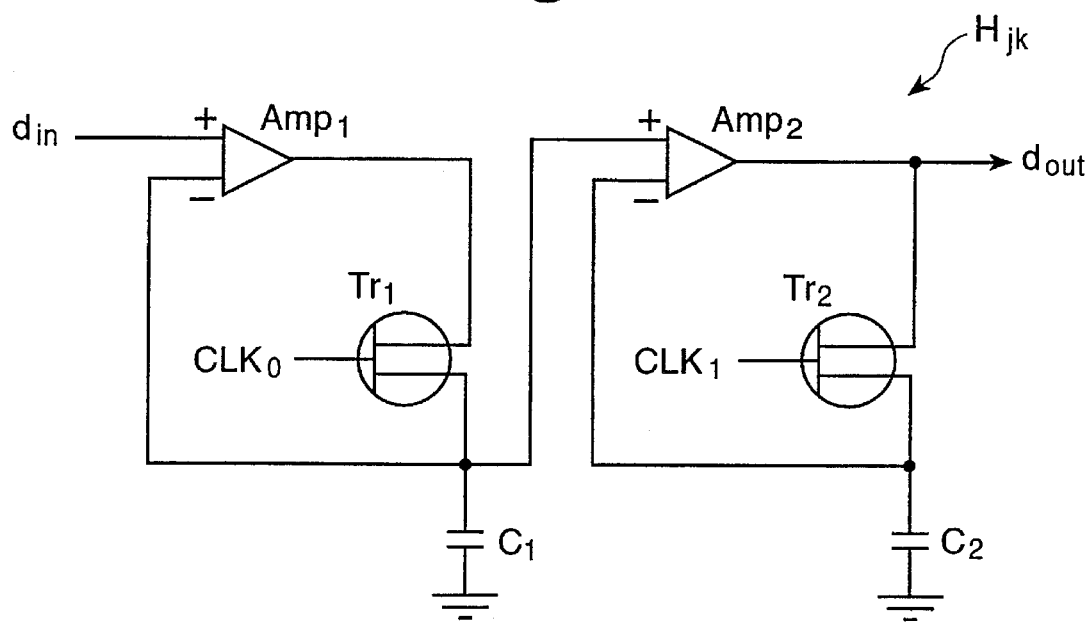
FIG. 8 shows a holding circuit of the filter circuit in FIG. 7.

FIG. 8 is an embodiment of hold circuit Hjk. Hjk is composed of a pair of operational amplifiers Amp1 and Amp2 and a pair of field effect transistors Tr1 and Tr2. Input data din is input to a non-inverted input. An output of Amp1 is connected to a drain of Tr1, and a source of Tr1 is grounded through capacitance C1 and fed back to a non-inverted input of Amp1. Clock CLK0 is input to a gate, and Tr1 is conductive when CLK0 is at a high level. When Tr1 is conductive, an output of Amp1 is controlled so that a voltage equal to di impresses to C1, and a charge is stored to make a charged voltage equal to din.

A charged voltage C1 is input to a non-inverted input of Amp2, and an output of Amp2 is connected to a drain of Tr2. A source of Tr2 is grounded through capacitance C2 and fed back to an inverted input of Amp2. A clock CLK1 having an opposite phase to CLK0 is input to a gate Tr2, and Tr2 is conductive in response to CLK1 at the reversed phase. When Tr2 is conductive, an output of Amp2 is controlled so that of a voltage equal to din of a charged voltage of C1 is provided to C2. An electric charge is stored in C2 until the charge voltage becomes din, then a voltage dout equal to din is output. Input voltage din is held during only 1 clock timing. The holding is performed without fail at the predetermined timing because the stages following C1 are not influenced while C1 is charging.

The addition circuit Ajk is realized by a circuit similar to FIG. 9, with 2 or 3 inputs.

Output signal Dout, output from the above circuit, is once held at Hout.

Figure 10:
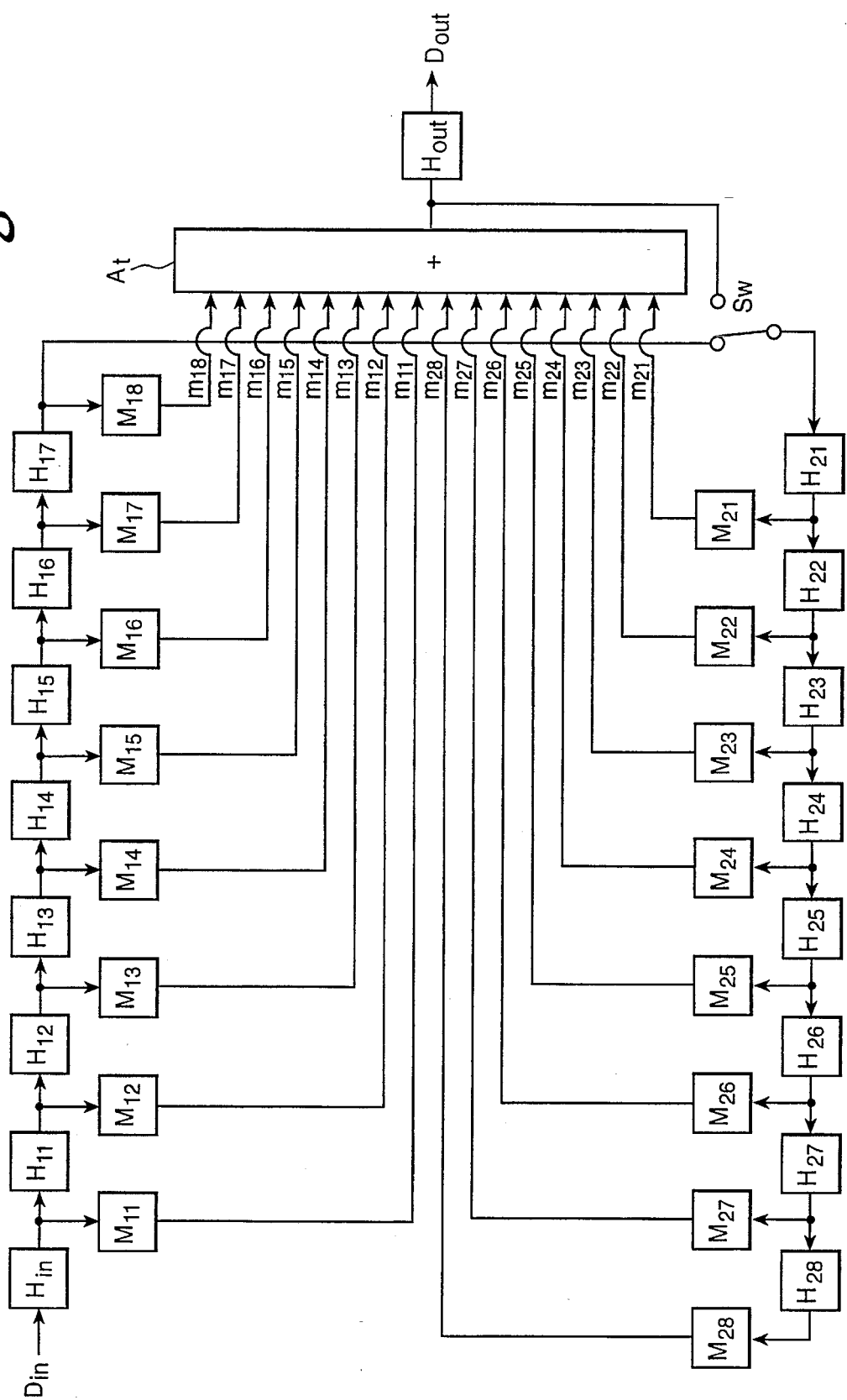
FIG. 10 illustrates a second embodiment of a filter circuit.
Figure 11:
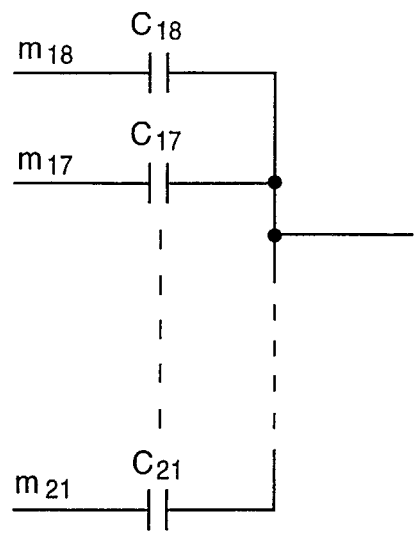
FIG. 11 shows an addition circuit of the second embodiment in FIG. 10.

FIG. 10 shows a second embodiment of a filter circuit which uses one addition circuit At, instead of using a plurality of addition circuits Ajk. Defining an output of each multiplication circuit Mjk to be mjk, as FIG. 11 shows, a capacitive coupling, consisting of capacitances Cjk connected in parallel, performs a weighted addition. This circuit works similar to the circuit of FIG. 9.

Hereinafter, the third embodiment of a multiplication circuit is described referring to the attached drawings.

Figure 12:
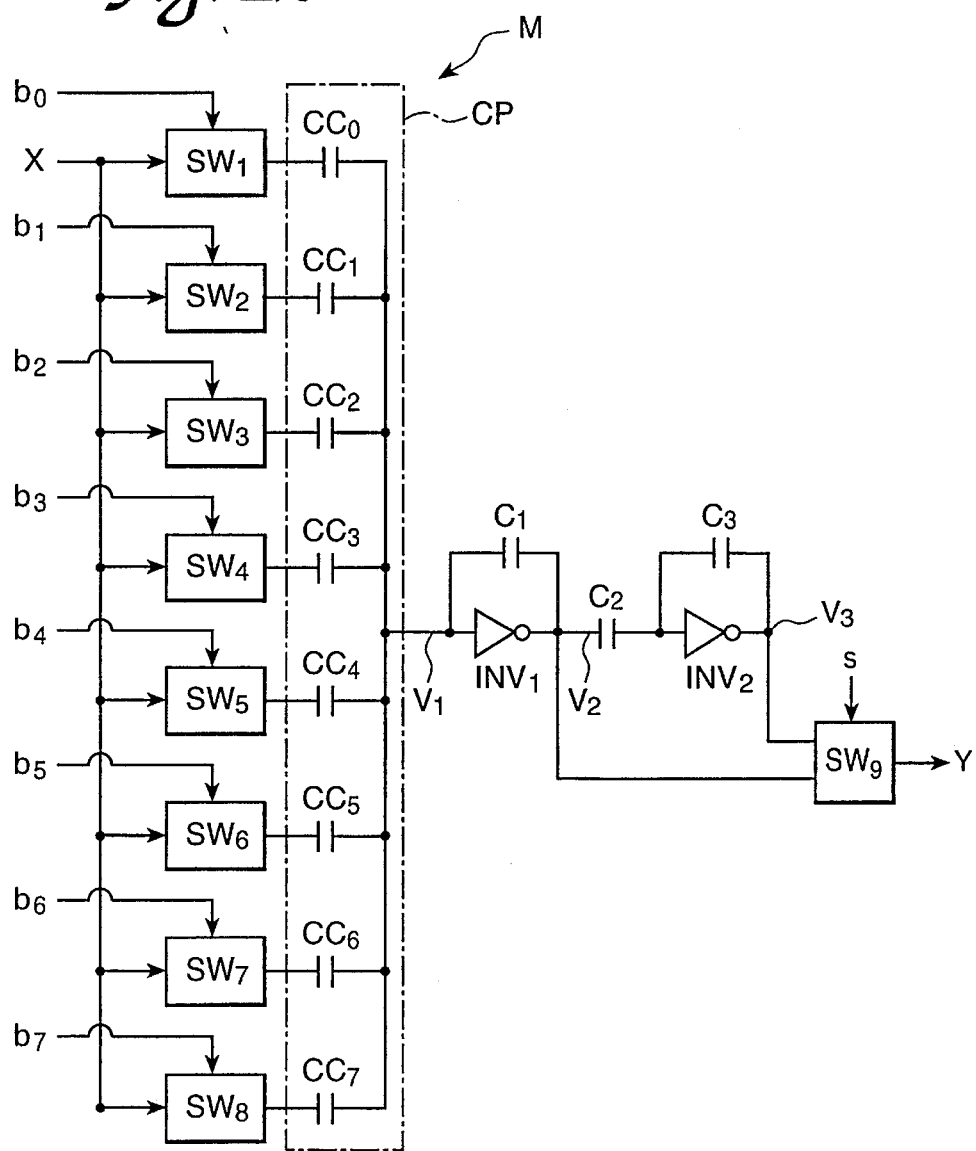
FIG. 12 shows a third embodiment of the multiplication circuit.

In FIG. 12, multiplication circuit M has a plurality of switching circuits SW1 to SW8 to which an analog input data X is input. Digital bits b0 to b7 are input to M as a control signal for these switching circuit. An output of each switching circuit is connected to an associated capacitance in a capacitive coupling circuit CP having a plurality of capacitances CC0 to CC7 connected in parallel, and an output of CP is connected to an inverter circuit INV1.

Capacities of capacitances CC0 to CC7 correspond to weights b0 to b7, that is, they are proportional to $2^0$ to $2^7$. When a unit capacity is c [F], then the following formulas are established $$CC0=2^0 \times c \ [F] \quad (45)$$

$$CC1=2^1 \times c \ [F] \quad (46)$$

$$CC2=2^2 \times c \ [F] \quad (47)$$

$$CC3=2^3 \times c \ [F] \quad (48)$$

$$CC4=2^4 \times c \ [F] \quad (49)$$

$$CC5=2^5 \times c \ [F] \quad (50)$$

$$CC6=2^6 \times c \ [F] \quad (51)$$

$$CC7=2^7 \times c \ [F] \quad (52)$$

Analog input voltage X passing through each switching circuit SWi is multiplied using weights in proportion to $2^i$. Therefore, by switching circuits SW1 to SWS, the following output V1 of CP is obtained.

$$V1 = X \times \sum_{i=0}^{7} (2i \times bi) \times c \quad (53)$$

In INV1, an output is fed back to an input side through capacitance C1, and a capacity of C1 is shown in Formula 10.

$$C1 = \sum_{i=0}^{7} CCi \quad (54)$$

INV1 generates inverted voltage (−X) with high accuracy.

Inverter circuit INV2 is connected to an output of inverter INV1, through capacitance C2. INV2 has a feed back circuit including capacitance C3.

In INV2, an output is generated as defined in formula 55, and formula 56 is established by arranging C2=C3.

$$V3=-V2(C3/C2)=X(C3/C2) \quad (55)$$

$$Y=X \quad (56)$$

As mentioned above, in multiplication circuit M, a multiplication of an analog input voltage X and input voltage (b0 to b7) as V3 is directly output from INV2, and the inverted output is output from INV1.

Outputs of iNV1 and INV2 are connected to switching circuit SW9 which is switched by sign bit s of a digital data. SW9 selectively outputs V2 or V3 as output voltage Y, inverted output V2 when S=1 (high) and non-inverted output V3 when S=0 (low).

Figure 13:
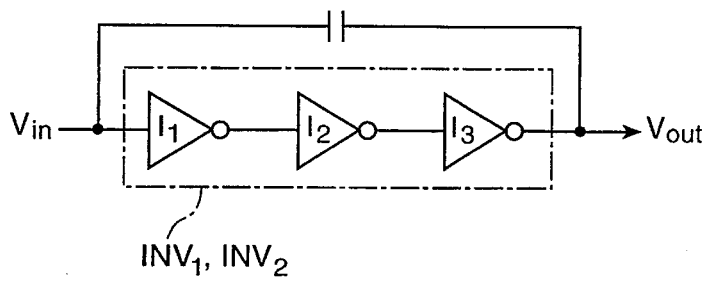
FIG. 13 shows inverter circuits INV1 and INV2 of the circuit in FIG. 12.
Figure 14:
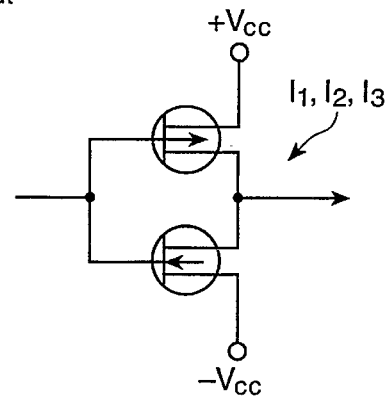
FIG. 14 shows one inverter in the inverter circuit of FIG. 13.

FIG. 13 shows inverter circuit INV1 and INV2, and FIG. 14 shows one inverter of inverter circuits INV1 and INV2.

As shown in FIG. 13, by serially connecting a plurality of inverters I1 to I3, output accuracy is improved. Inverters I1 to I3 consist of a pMOS and an nMOS. A source of pMOS is connected to a drain of nMOS and a source of nMOS is connected to a voltage source. An input voltage is input to voltages of these MOSs, and an output is generated at a juncture of both MOSs.

Figure 15:
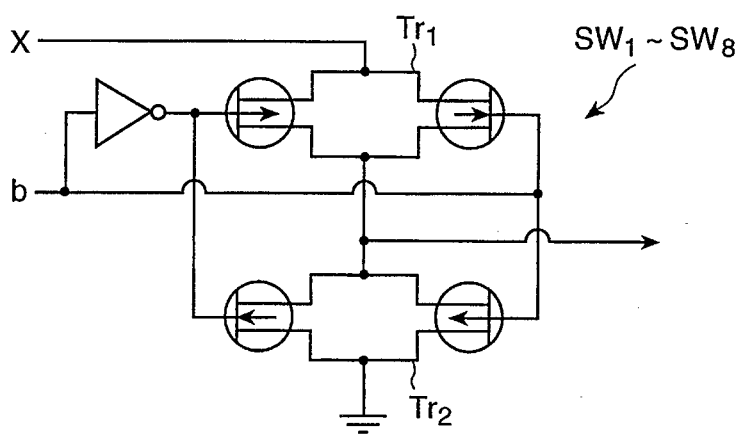
FIG. 15 shows an example of a switching circuit in switching circuits SW1 to SW8.

FIG. 15 shows switching circuits SW1 to SW8, each of which consists of a CMOS switch having one CMOS Tr1 and one dummy transistor Tr2 serially connected to an input. Input voltage X is input to a drain of Tr1, and an output voltage is generated from the juncture of Tr1 and Tr2. An inverted digital input voltage is input to the gates of the pMOS in Tr1 and the nMOS in Tr2, and a non-inverted digital input voltage is input to the gates of the nMOS in Tr1 and the pMOS in Tr2. As a result, a switching of X is realized without a voltage drop.

Figure 16:
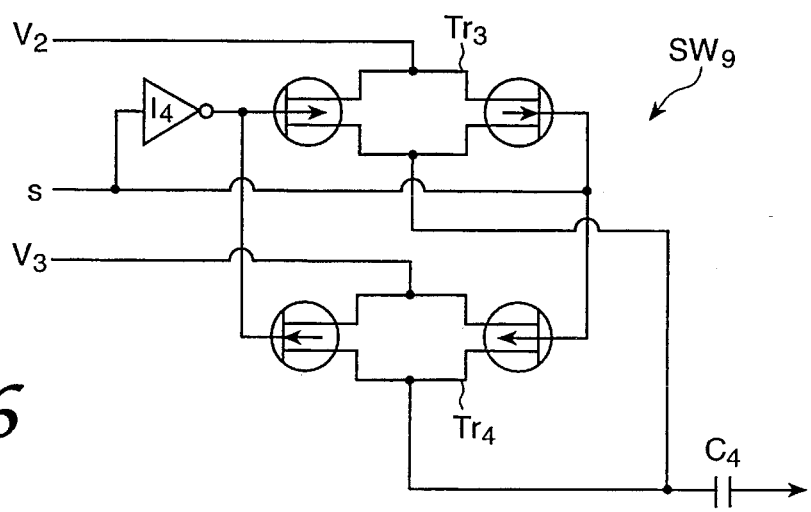
FIG. 16 shows a switching circuit SW9.

FIG. 16 shows switching circuit SW9. V2 and V3 are connected to a source of a pMOS in each CMOS Tr3 and Tr4. A drain of the pMOS is connected to a common capacitance C4. Sign bit s is directly connected to a gate of the nMOS in Tr3 and to a gate of the pMOS in Tr4, and an inverted signal is input to a gate of a pMOS in Tr3 and a gate of the nMOS in Tr4 via inverter I4. When the sign bit is "1", Tr3 is conductive and an inverted output V2 is impressed to C4. When the sign signal s is "0", Tr4 is conductive, and the non-inverted output V3 is impressed to C4. Therefore, it is possible to generate positive/negative outputs corresponding to the sign bit.

As mentioned above, an analog input voltage is controlled to be transmitted to an output terminal by a switching signal of digital input voltage. A digital input signal of a plurality of bits is used for a plurality of analog outputs to be weighted and integrated by a capacitive coupling. A sign bit is added to a capacitive coupling, with two times the weight of the highest bit of a digital data. As a result, it is possible to directly multiply analog data and digital data without A/D or D/A conversion.

Hereinafter, the fourth embodiment of a multiplication circuit is described with reference to the attached drawings.

Figure 17:
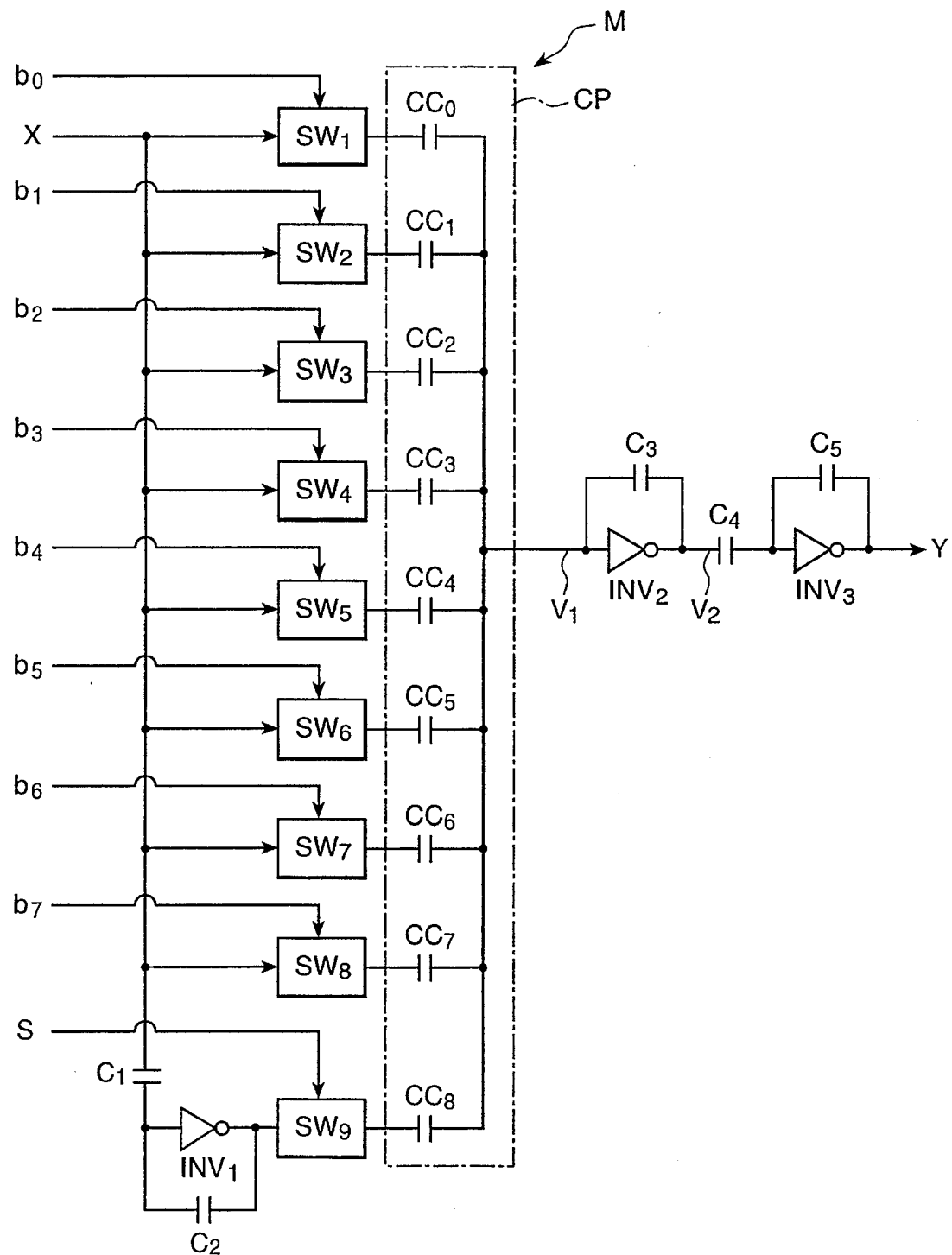
FIG. 17 illustrates a fourth embodiment of the multiplication circuit.

In FIG. 17, multiplication circuit M has a plurality of switching circuits SW1 to SW8 connected to an analog input voltage X, and digital input data b0 to b7, corresponding to each bit of a digital data, is input as a control signal in these switching circuits.

An output of each switching circuit is connected to an associated capacitance in capacitive coupling circuit CP, which comprises a plurality of capacitances CC0 to CC7 connected in parallel CP outputs or output voltage Y through inverter circuits INV1 and INV2. Capacities of capacitances CC0 to CC7 are arranged corresponding to weights b0 to b7, that is, it is arranged corresponding to $2^0$ to $2^7$. When a unit capacity c is [F], then the following formulas are obtained.

$$CC0=2^0 \times c \ [F] \quad (57)$$

$$CC1=2^1 \times c \ [F] \quad (58)$$

$$CC2=2^2 \times c \ [F] \quad (59)$$

$$CC3=2^3 \times c \ [F] \quad (60)$$

$$CC4=2^4 \times c \ [F] \quad (61)$$

$$CC5=2^5 \times c \ [F] \quad (62)$$

$$CC6=2^6 \times c \ [F] \quad (63)$$

$$CC7=2^7 \times c \ [F] \quad (64)$$

By these formulas, analog input voltage X passing through each switching circuit SWi is multiplied by a weight in proportion to $2^i$.

Furthermore, a capacitive coupling includes capacitance CC8. CC8 reverses an analog input voltage X through inverter INV1 and switching circuit SW8. A digital input voltage corresponding to a sign bit of the digital data is input to SW8. An output of INV1 is fed back to an input side through capacitance C2, and C1=C2. INV1 generates an inverted voltage (−X) or X with high accuracy.

A capacity of CC8 is arranged in the following Formula 65, and by switching circuits SW1 to SW8, the output V1 of CP is obtained.

$$CC8=2^8 \times c \quad (65)$$

$$V1 = X \left\{ \sum_{i=0}^{7} (2^i \times bi) - 2^8 xs \right\} \quad (66)$$

Output V1 is converted to the following formula by inverter circuit INV2 having a feed back circuit including capacitance C3.

$$V2 = -V1 \left( C3 / \sum_{i=0}^{7} CCi \right) \quad (67)$$

Inverter circuit INV3 is connected to an output of inverter circuit INV2 through capacitance C4, and a feed back circuit including capacitance 5 is arranges at INV3.

In INV3, an output of Formula 68 is generated, and C4=C5. Then Formula 69 is obtained.

$$Y=-V2 \ (C5/C4)=V1 \ (C5/C4) \quad (68)$$

$$Y=V1 \quad (69)$$

There is provided a multiplication circuit for directly multiplying an analog input data x and digital input voltage (b0 to b7). It is possible to select inverting or non-inverting of output data in response to sign bit s.

The inverters INV1, INV2 and switching circuit SW1 to SW9 are similar to the circuits in FIGS. 13 to 15.

Hereinafter, a scaler circuit is described referring to the attached drawings.

Figure 18:
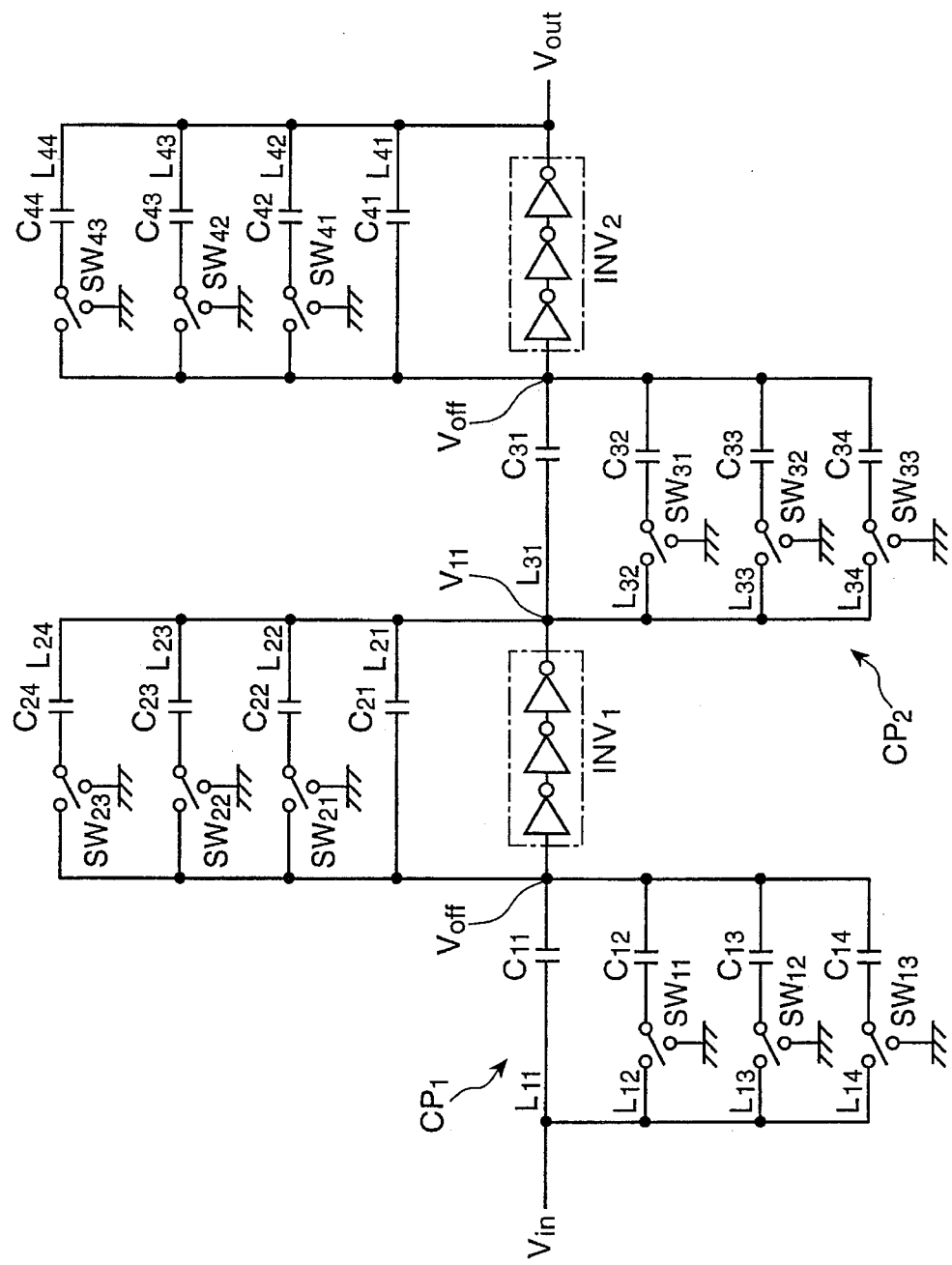
FIG. 18 is a fifth embodiment of the multiplication circuit.

FIG. 18 shows the fifth embodiment of multiplication circuit used as a scaler circuit. The first coupling capacitance CP1, the first inverter INV1, the second coupling capacitance CP2 and the second inverter INV2 are serially connected, and input voltage Vin is input to CP1.

CP1 consists of a plurality of input circuits L11, L12, L13 and L14 including capacitances C11, C12, C13 and C14. Capacitances are selectively connected to input circuits L12, L13 and L14 or ground by selectors SW11, SW12 and SW13.

The composite capacity of C11, C12, C13 and C14 is (C11+C12+C13+C14), and a capacity of a coupling capacitance (shown by an effective composite capacity below) connecting Vin to INV1 becomes (C11+ΣC1i). ΣC1i is a composite capacity of capacitance C1i connected to an input side through SW1i.

In INV1, a plurality of feed back circuits L21, L22, L23 and L24 feed back its output to its input, and capacitances C21, C22, C23 and C24 are connected in feed back circuits L21, L22, L23 and L24. C22, C23 and C24 are selectively connected to feed back circuits L22, L23 and L24 or ground by selectors SW21, SW22 and SW23. A composite capacity of C21, C22, C23 and C24 is (C21+C22+C23+C24). A capacity of a coupling capacitance connecting the output to the input of INV1 (shown by an effective composite capacity below) is ΣC2i.

CP2 has a plurality of connecting circuits L31, L32, L33 and L34 including capacitances C31, C32, C33 and C34. Capacitances C32, C33 and C34 are selectively connected to connecting circuits L32, L33 and L34 or ground by selectors SW31, SW32 and SW33. A composite capacity of C31, C32, C33 and C34 is (C31+C32+C33+C34), and a capacity of a coupling capacitance connecting INV1 and INV2 (shown by an effective composite capacity below) becomes (C31+ΣC3i). ΣC3i is a composite capacity of capacitance C3i connected to a connecting side through SW3i.

In INV2, a plurality of feed back circuits L41, L42, L43 and L44 for feeding back its output to its input, and capacitances C41, C42, C43 and C44 are connected in L41, L42, L43 and L44. C42, C43 and C44 are selectively connected to feed back circuits L42, L43 and L44 or ground by selectors SW41, SW42 and SW43. A composite capacity of C41, C42, C43 and C44 is (C41+C42+C43+C44), and a capacity of a coupling capacitance connecting the output and input of INV1 (shown by an effective composite capacity below) is ΣC4i. which is a composite capacity of capacitance C4i connected to a feed back side through SW4i.

INV1 and INV2 have good linear characteristics of relationships between the input and output. Its output is the multiplication result of Vin by an effective composite capacity, shown in the Formula below.

$$m = (C11 + \Sigma C1i)/(C21 + \Sigma C2i) \quad (70)$$

The term m is controlled by switching SW11 to SW13 and SW21 to SW23, and its accuracy depends on the accuracy of a capacity portion of a capacitance (because it is not an absolute value), so that it is comparatively easy to guarantee an accuracy in a LSI process.

In CP2 and INV2, capacities are arranged according to Formula 71, and groups of SW21, SW31 and SW41, SW22, SW32 and SW42, SW23, SW33 and SW43 and SW24, SW33 and SW44 are interlocked to each other in switching.

$$C21 = C31 = C41, C22 = C32 = C42, C23 = C33 = C43, C24 = C34 = C44 \quad (71)$$

Therefore, a relationship of Formula 72 is always guaranteed.

$$(C21 + \Sigma C2i) = (C31 + \Sigma C3i) = (C41 + \Sigma C41) \quad (72)$$

Furthermore, Formula 73 is arranged.

$$(C11 + C12 + C13 + C14) = (C31 + C32 + C33 + C34) \quad (73)$$

Here, it is assumed that each offset voltage Voff of input side of INV1 and INV2 are equal to each other. As a result, a relationship between an input and output voltages Vin and Vout is calculated in Formulas 74 and 75. An output of INV1 is defined as V11.

$$(\Sigma C1i Vin + \Sigma C2i V11)/(\Sigma C1i + \Sigma C2i) = Voff \quad (74)$$

$$(\Sigma C3i V11 + \Sigma C2i Vout)/(\Sigma C3i + \Sigma C4i) = Voff \quad (75)$$

According to the above relationships, Formula 76 is obtained.

$$Vout = mVin\{(C31 + \Sigma 3i)/(C41 + \Sigma i)\} + \quad (76)$$
$$[\{(C41 + \Sigma i + C31 + C32 + C34)/(C41 + \Sigma 4i)\} -$$
$$\{(C31 + \Sigma 3i)(C21 + \Sigma 2i)\}/$$
$$\{(C41 + \Sigma 4i)(C21 + \Sigma 2i)\}]Voff$$

By the relationships of Formulas 71, 72 and 73. Formula 77 is obtained.

$$mVin\{(C31 + \Sigma C3i)/(C41 + \Sigma 4i)\} \{(C41 + \quad (77)$$
$$\Sigma 4i + C31 + C32 + C34)/(C41 + \Sigma C4i)\} -$$
$$U\{(C31 + \Sigma C3i)(C21 + \Sigma C2i)\}/$$
$$\{(C41 + \Sigma C4i)(C21 + \Sigma C2i)\}] = 0$$

Then, the offset is cancelled.

The above assumption, that offset of INV1 and INV2 are equal, is well known as comparative good approximation.

A scaler circuit realizes accurate control of an output level and it can cancel the influence of an offset.

Figure 19:
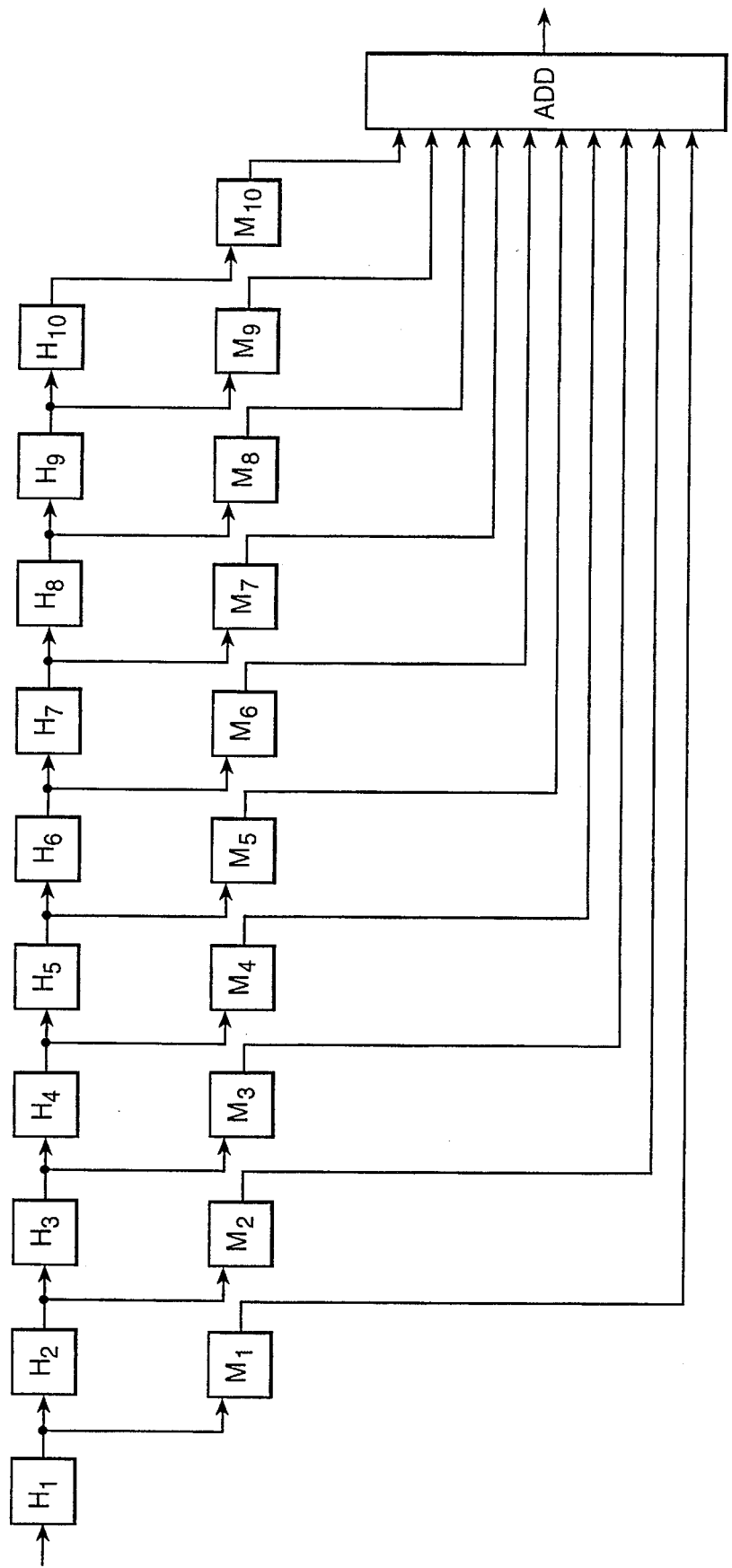
FIG. 19 is a filter circuit as the third embodiment.
Figure 20:
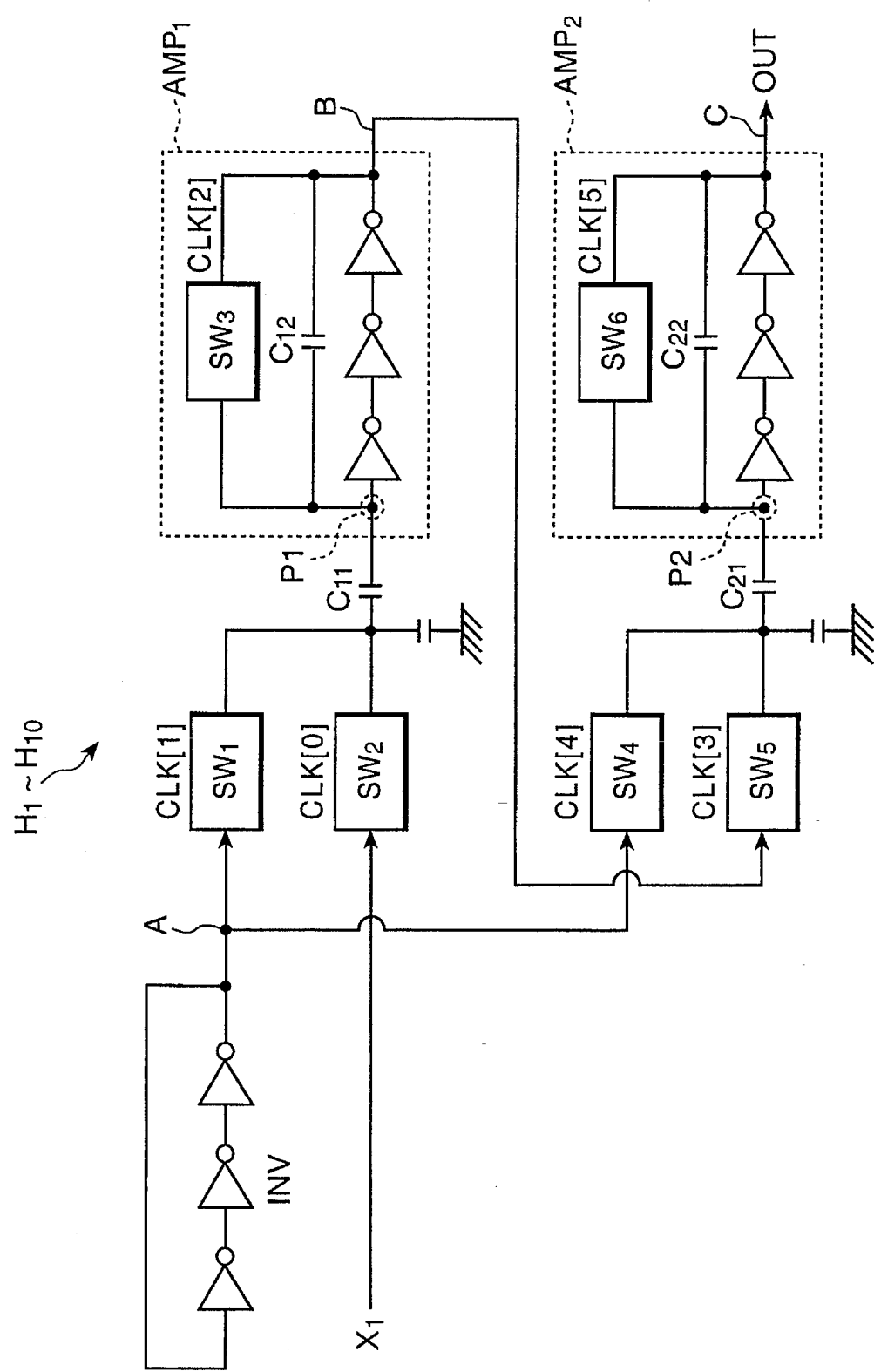
FIG. 20 is a first embodiment of the sample/hold circuit.

As mentioned above, inverters with feed-back capacitances are serially connected, a multiplication concerning an input capacitance and the feed back capacitances and offset voltages of the first and second inverters are cancelled to each other. Then, a level control is accurately performed.

in FIG. 19, the third embodiment of filter circuit is composed of a plurality of sample hold circuits H1 to H10 serially connected through transfer circuits. A plurality of multiplication circuits M1 to M10 are connected to sample hold circuits H1 to H10 at branching outputs of the sample hold circuits. An output of each multiplication circuit is connected to a multi-input adder ADD.

in FIG. 20, the first embodiment of sample hold circuits H1 to H10 is shown.

Each sample hold circuit consists of an input side switch SW1, an input side capacitance C11, a first amplifier AMP1, an intermediate switch SW5, an intermediate capacitance C21 and a second amplifier AMP2, serially connected. The first input initialized switch SW1 and the second initialized switch SW4 are parallelly connected to the input side switch SW2 and the intermediate switch SW5, respectively.

Furthermore, an inverter INV is serially connected to the switch SW1 and switch SW4. In the first and the second amplifiers AMP1 and AMP2, an input and an output are connected by feed-back capacitances C12 and C22, and the input and the output are switchably connected by the first and second switches SW3 and Sw6.

FIGS. 23(a)-23(f) provide a timing chart of the opening and closing of switches from SW1 to SW6.

At the initializing condition, the first input initialized switch SW1 and the first initialized switch SW3 of the first amplifier AMP1 are closed at the same time. Because the third inverter INV is formed on a same wafer, electric potentials of A and B of a reference voltage are equal and the voltage difference becomes almost 0. P1's initializing in the first amplifier AMP1 is performed, and an electrical charge causing an error is deleted.

Then, after a predetermined time, the first initialized switch SW3 of the first amplifier AMP1 is opened, and the first initialized switch SW1 is also opened after a predetermined time. At the same time, the first input initialized switch SW1 is opened and an input side switch SW2 is closed. Then, analog voltage X1 is input to the first amplifier AMP1. The reference voltage is kept stable by INV.

As mentioned above, P1 is initialized just before analog voltage X1 is input to the first amplifier AMP1, so that analog voltage X1 with little error is input to the first amplifier AMPi.

Then, after a predetermined time, input side switch SW2 is opened, and the second initialized switch SW4 and the second initialized switch SW6 of the second amplifier AMP2 are closed at the same time, after a predetermined time.

When the second initialized switch SW4 and the second initialized switch SW6 of the second amplifier are closed at the same time, electric potentials A and C of a reference voltage becomes equal and its voltage difference becomes almost 0 because the 3 stages of inverter INV are formed on the same wafer P2's initializing in the second amplifier AMP2 is performed, and an electrical charge causing error is deleted.

Then, after a predetermined time, the second initialized switch SW6 of the second amplifier AMP2 is opened, and the second input initialized switch SW4 is opened, too, after a predetermined time. At the same time, the second input initialized SW4 is opened, an intermediate switch SW5 is opened. Then, analog voltage X1 output from the first amplifier AMP1 is input to the second amplifier.

As mentioned above, analog voltage X1 with little error is input to the second amplifier AMP2, because P2 is initialized just before analog voltage X1 is input to the second amplifier.

As shown in the timing chart of FIGS. 23a–23f, switching operations are sequentially performed. In the next period, analog data X2 is input, thereafter, X3 . . . and Xn are successively input to the circuit H1 one after another.

The second amplifier, as mentioned above, outputs an analog voltage X1 as an output of sample hold circuit Hi to sample hold circuit H2, and analog voltage X1 is sequentially transferred to sample hold circuit. H10. In the same way, the following analog voltages X2 . . . and Xn is sequentially transferred to each sample hold circuit H2 to H10.

Each sample hold circuit HI to H9 transfers analog voltages X1 . . . to Xn to the following sample hold circuits, and in the other side, analog voltages X1 . . . and Xn are output to multipliers M1 to M9 corresponding to each hold circuit through a branching circuit. Sample hold circuit H10 sequentially outputs analog voltages X1 . . . and Xn only to the multiplier circuit M10.

Figure 21:
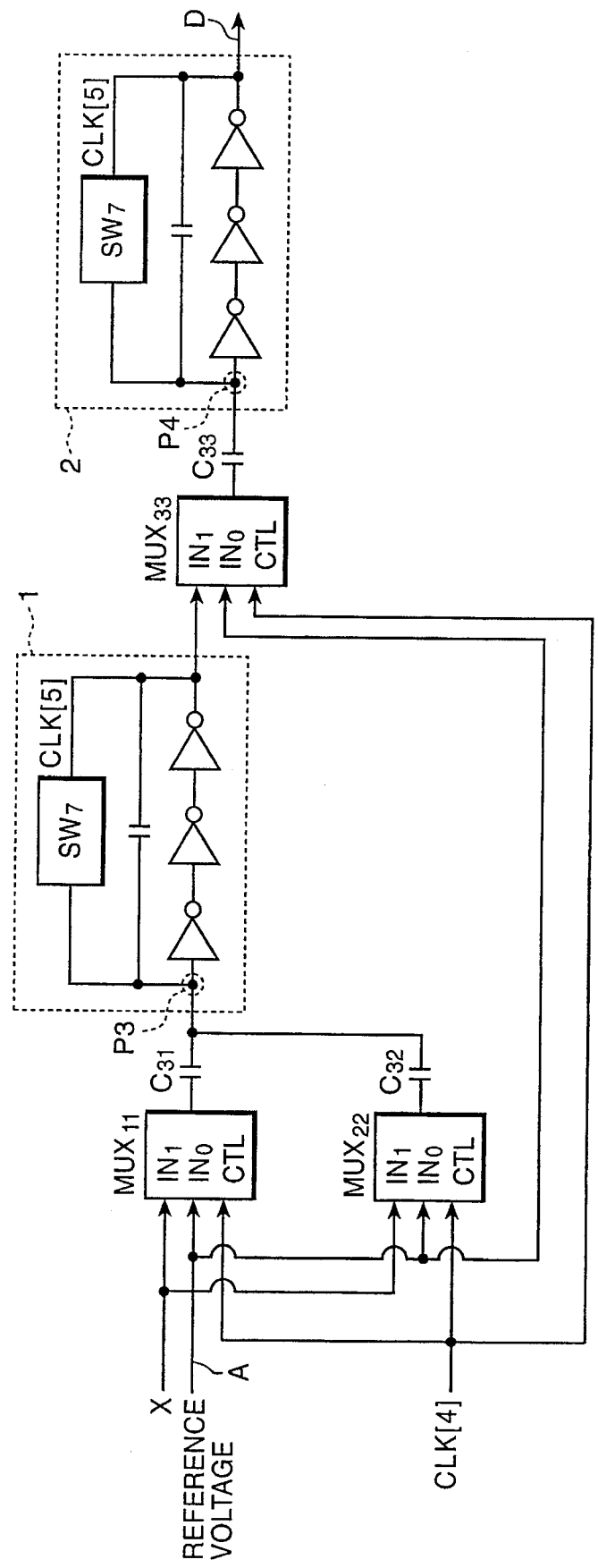
FIG. 21 is a sixth embodiment of the multiplication circuit.

FIG. 21 shows the sixth embodiment of a circuit diagram of multipliers M1 to M10. A multiplier has multi-plexers MUX11, MUX22 and MUX33 and amplifiers 1 and 2, and the third initializing switch SW7 is connected to these amplifiers 1 and 2. A switching operation of amplifiers 1 and 2 is performed by the third initializing switch SW7.

Analog data X1 and a reference voltage are input to multi-plexers MUX11, MUX22 and MUX33, which are controlled by control signal CTL.

When the third initialized switch SW7 of amplifiers 1 and 2 and IN0 of multi-plexer MUX11, MUX22 and MUX33 are opened at the same time, electric potentials A and D of a reference voltage becomes equal and the voltage difference becomes almost 0 because 3 stage inverters are formed on the same wafer. The initializing P3 of amplifier 1 and initializing P4 of amplifier 2 are performed, and an electrical charge causing error is deleted.

Then, after a predetermined time, the third initialized switch SW7 of amplifiers 1 and 2 is opened. Furthermore, after a predetermined time, IN0 of multi-plexers MUX11, MUX22 and MUX33, INV1 of these multi-plexers are simultaneously closed, and analog voltage X1 is input to multi-plexers MUX11 and 22. Multi-plexers 11 and 22 output analog voltage X1 to amplifier 1.

P3 of amplifier 1 is initialized just before analog voltage X1 is input, so that analog voltage X1 with substantially no error is input to amplifier 1. Amplifier 1 outputs analog voltage X1 to amplifier 2 through multi-plexer MUX33.

P4 is initialized before analog voltage X1 is input in amplifier 2, so that analog voltage X1 has no error and is input to amplifier 2.

Each multiplier M1 to M10 multiplies analog voltages X1 . . . and Xn by a multiplier sequentially input from sample hold circuits Hi to H10, and outputs a multiplication result to adder ADD.

Figure 22:
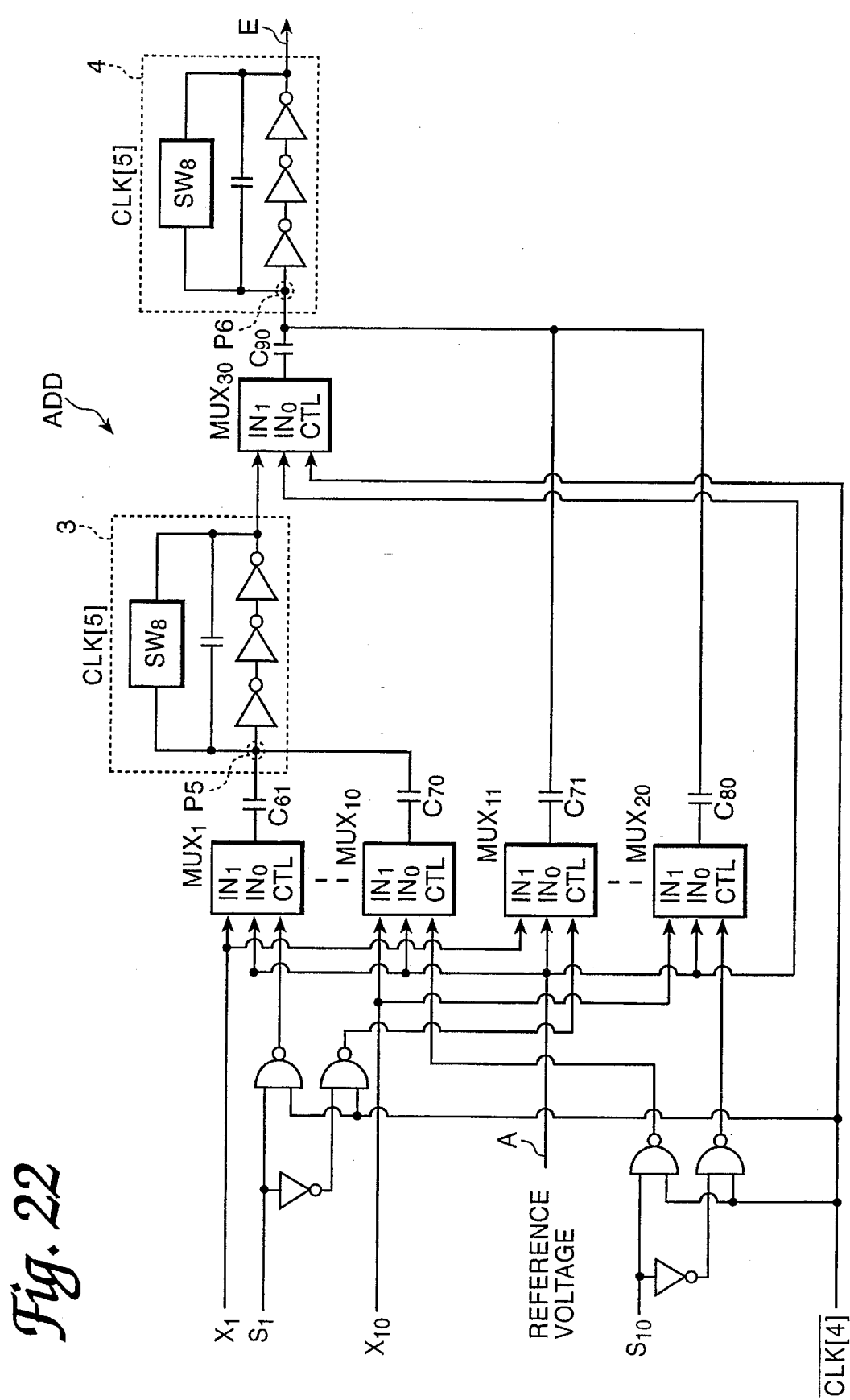
FIG. 22 is a fourth embodiment of the addition circuit.
Figures 23A, 23B, 23C, 23D, 23E, 23F:
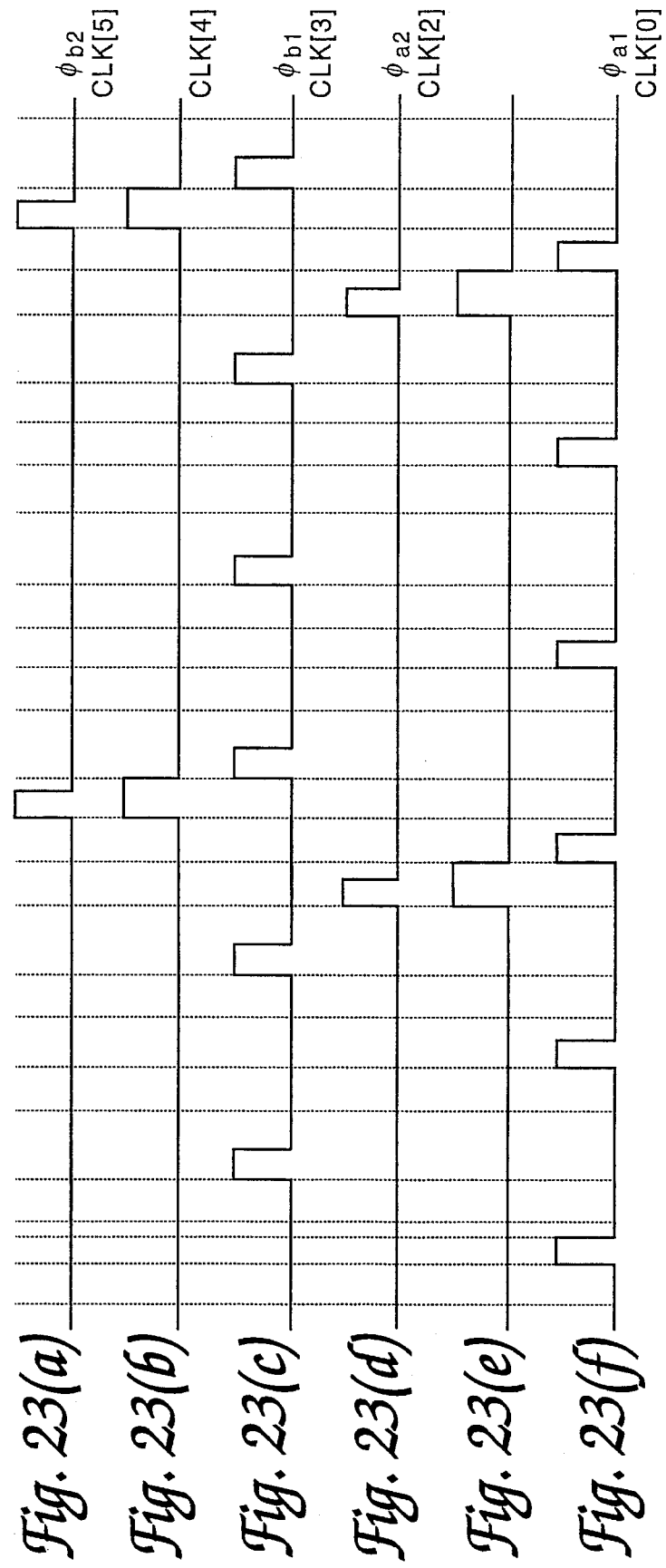
FIGS. 23(a)–23(f) illustrate waveforms in a timing chart of the switching means.

In FIG. 22, the fifth embodiment of an addition circuit is shown as a circuit diagram of adder ADD. Adder ADD is composed of a plurality of muiti-plexers MUX1 to MUX10 and MUX11 to MUX20 and amplifiers 3 and 4. Multi-plexer MUX30 is arranged between amplifiers 3 and 4.

The third initializing switch SW8 is connected to amplifiers 3 and 4, and a switching operation of these amplifiers 3 and 4 is performed by the third initialized switch SW8.

Analog data X1 to X10 and a reference voltage are input to multi-plexers MUX1 to MUX10, MUX11 to MUX20 and MUX30, which are controlled by control signal CTL.

When the third initialized switch SW8 of amplifiers 3 and 4 and IN0 of multi-plexer MUX1 to MUX10, MUX11 to MUX20 and MUX30 are opened, electric potentials A and E of a reference voltage becomes equal and the voltage difference becomes almost 0. The initializing in P5 of amplifier 3 and P6 in amplifier 4 is performed, and an electrical charge causing error is deleted.

Then, after a predetermined time, the third initializing switch SW8 of amplifiers 3 and 4 is opened. Furthermore IN0 of multi-plexers MUX1 to MUX10, MUX11 to MUX20 and MUX30, INV1 of these multi-plexers are simultaneously closed, and analog voltages X1 to X10 are input to multi-plexers MUX1 to MUX10 or multi-plexers MUX11 to MUX20.

Analog voltages X1 to X10 are input to multi-plexers MUX1 to MUX10, and these multi-plexers output analog voltages X1 to X10.

P5 in amplifier 3 is initialized before analog voltage X1 is input, therefore, analog voltages X1 to X10 with no error are input to amplifier 3. Amplifier 3 outputs an a calculation result of addition and multiplication of analog voltages X1 to X10 to multiplier 4 through multi-plexers MUX30.

P6 in amplifier 4 is initialized before the calculation results of analog voltages X1 to X10 are input to amplifier 4, and data with no error is input to amplifier 4.

On the other hand, when analog voltages X1 to X10 are input to multi-plexers MUX11 to MUX20, these multi-plexers output a calculation result of addition and multiplication of analog voltage X1 to X10 to amplifier 4. A calculation result of analog voltages X1 to X10 with no error is input to amplifier 4. Amplifier 4 of Adder ADD a calculation result of analog voltages X1 to X10 as a operational result of a successive operational circuit.

As mentioned above, the second and the third initialized switches are closed after a period of time. The first initialized switch is closed and the first initialized switch is closed after the second the third initialized switches are opened so that it is possible to prevent an error by charged voltage by initializing.

Figure 24:
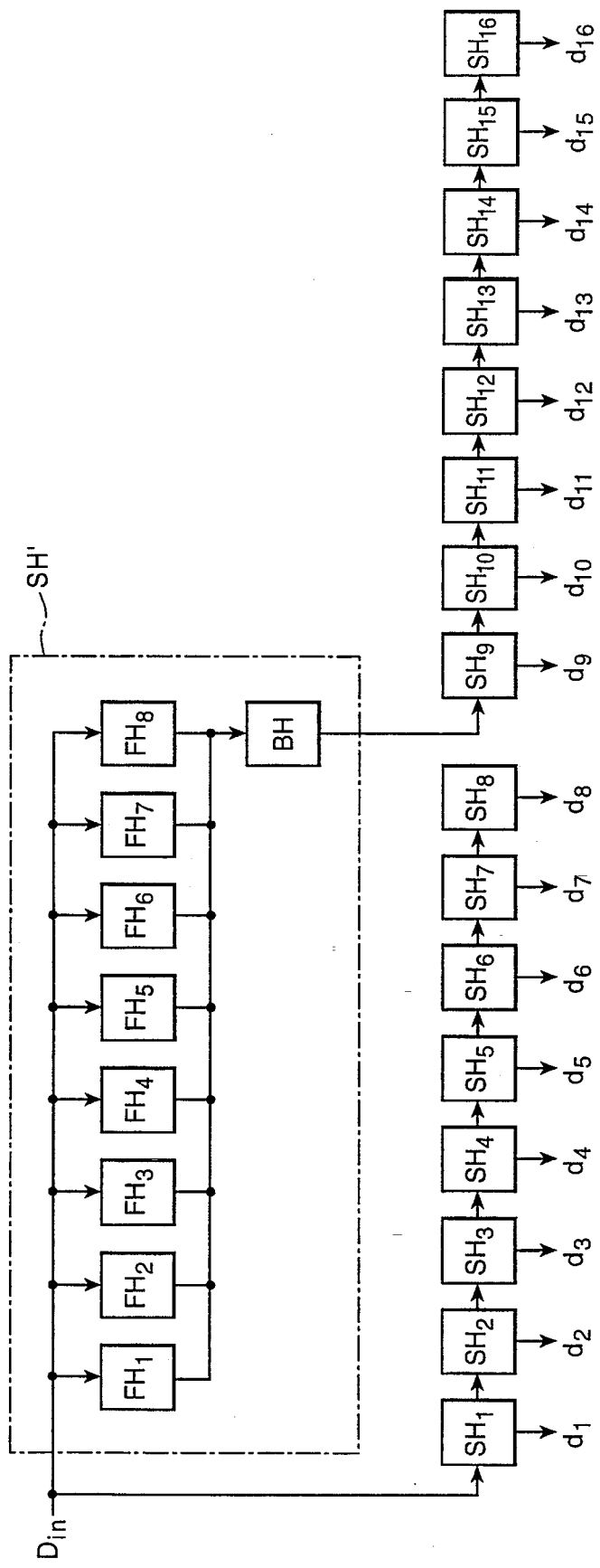
FIG. 24 is the total circuit of the second embodiment the of sample/hold circuit.

In FIG. 24, the total circuit of the second embodiments of sample/hold circuit is shown. The sample hold circuit has a plurality of the first sample hold portions SH1 to SH16, and SH1 to SH8 and SH9 to SH16 are serially connected. Input voltage Din is directly input to SH1, and input voltage Din is input through sample hold circuits FH1 to FH8 and BH to SH9.

Figure 25:
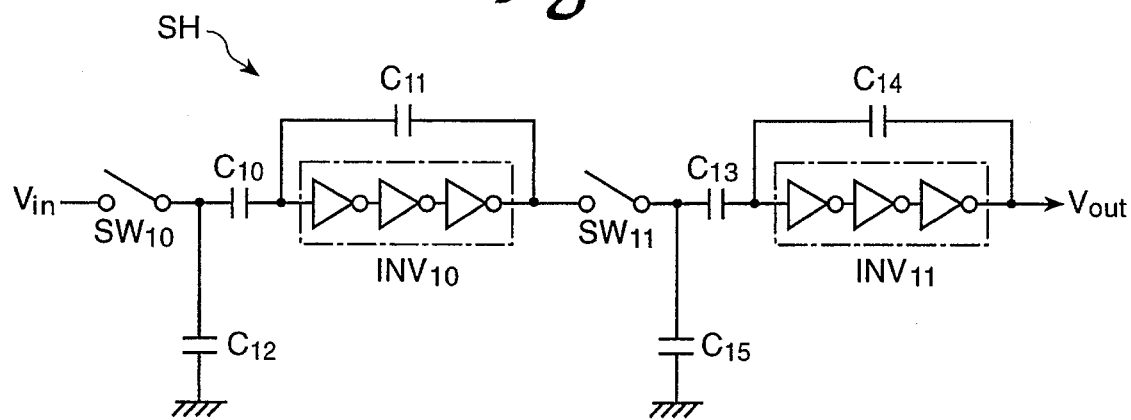
FIG. 25 is a sample/hold portion of the circuit in FIG. 27.

FIG. 25 shows a composition of SH1 to SH16. These SHs are shown by a representative reference SH in the figure. SH includes switching means SW10, capacitance 10, inverter INV10, switching means SW11, capacitance C13 and inverter INV11 serially connected. The outputs of INV10 and INV11 are fed back to their inputs through capacitances C11 and C14. When SW10 is closed and SW11 is opened, C10 is charged by voltage Vin connected to SW10. A charged voltage of C10 is controlled by INV10 and C11 to have an output voltage of iNV10 equal to Vin. Between SW10 and C10, grounded capacitance C12 is connected, and it compensates electric charges during charging and discharging at high speed. Then, SH outputs input voltage Vin once held as output voltage Vout.

SHi (i=1 to 8) transfers input voltage Din(i=1) or an output voltage of the previous stage SHi−1 (i≧2) after once holding it, and output voltage Di is generated. SHi (i=9 to 16) transfers an output voltage of SH' (i=9) below or an output voltage of the previous stage (i≧10) to the next SH1+1 after sampling and holding, and output voltage di is generated.

In performing such a sample/hold, deviation of the transistors causes error in outputs of INV10 and INV11 as well as error in Di. When data is sequentially transferred, errors are accumulated and expanded.

In order to prevent the accumulated errors from exceeding the allowable value, transferring of Din is executed at SH1 to SH8, and Din is input through sample hold circuit SH' in SH9 to SH16.

Sample hold circuit SH' has a plurality of front portions of holding circuits FH1 to FH8 parallelly connected to Din and a back portion of holding circuit BH commonly connected to an output.

Figure 26:
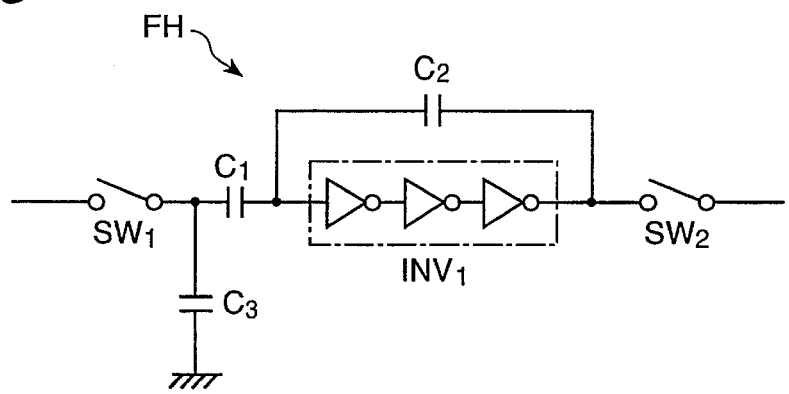
FIG. 26 shows the leading holding portion.

FIG. 26 shows a composition of FH1 to FH8. They are represented by a reference FH in the figure. FH includes switching means SW1, capacitance C1, inverter INV1 and switching means SW2 serially connected. An output of INV1 is fed back to the input through capacitance C2. When SW1 is closed, C1 is charged by Din. A charged voltage of C1 is controlled by INV1 and C2 so that output voltage of INV1 is equal to Din. Between SW1 and C1, a grounded capacitance is connected and it compensates electric charge during charging and discharging of Cl in high speed. Then, a sample/hold of input voltage Din is executed.

The sample/hold is executed in one of FH1 to FHS. For example, it is executed in a circulated order such as FH1→ FH2→FH3→FH4→FH5→FH6→FH7→FH8→FH1. Then, Din is delayed 7 clock cycles, and output to BH.

Figure 27:
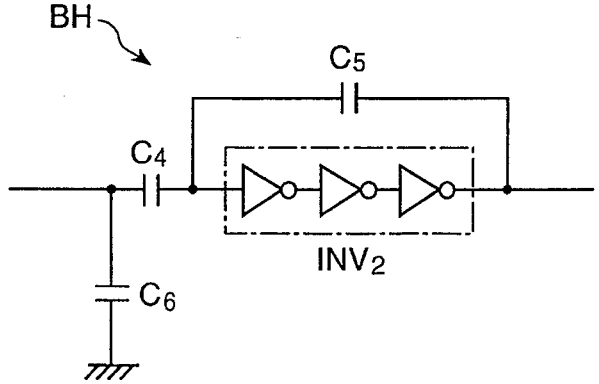
FIG. 27 shows the trailing holding portion.

BH is composed as shown in FIG. 27. It serially connects capacitance C4 and inverter INV2, and an output of INV2 is fed back to the input through capacitance C5. When SW2 is closed in one of FHs, C4 is charged by an output voltage of INV1. A charged voltage of C4 is controlled by INV2 and C5 so that an output voltage of INV2 is equal to an output of INV1. Grounded capacitance C6 is connected at the front stage of C4, and it compensates electric charge during charging and discharging of C4 in high speed.

A voltage held at BH is transferred to SH9, and Din is transferred to SH9 at the next timing corresponding to the timing when Din is transferred to SH8. It is equivalent to a case where SH1 to SH16 are serially connected. The transferring from FH' to BH is performed once, hold error is decreased in comparison to the transferring passing through SH1 to SHS.

As mentioned above, it is possible to guarantee an accuracy of d1 to d16 by dividing serial hold circuits into two stages and by transferring data from the first stage to the second stage through SH'.

Figure 28:
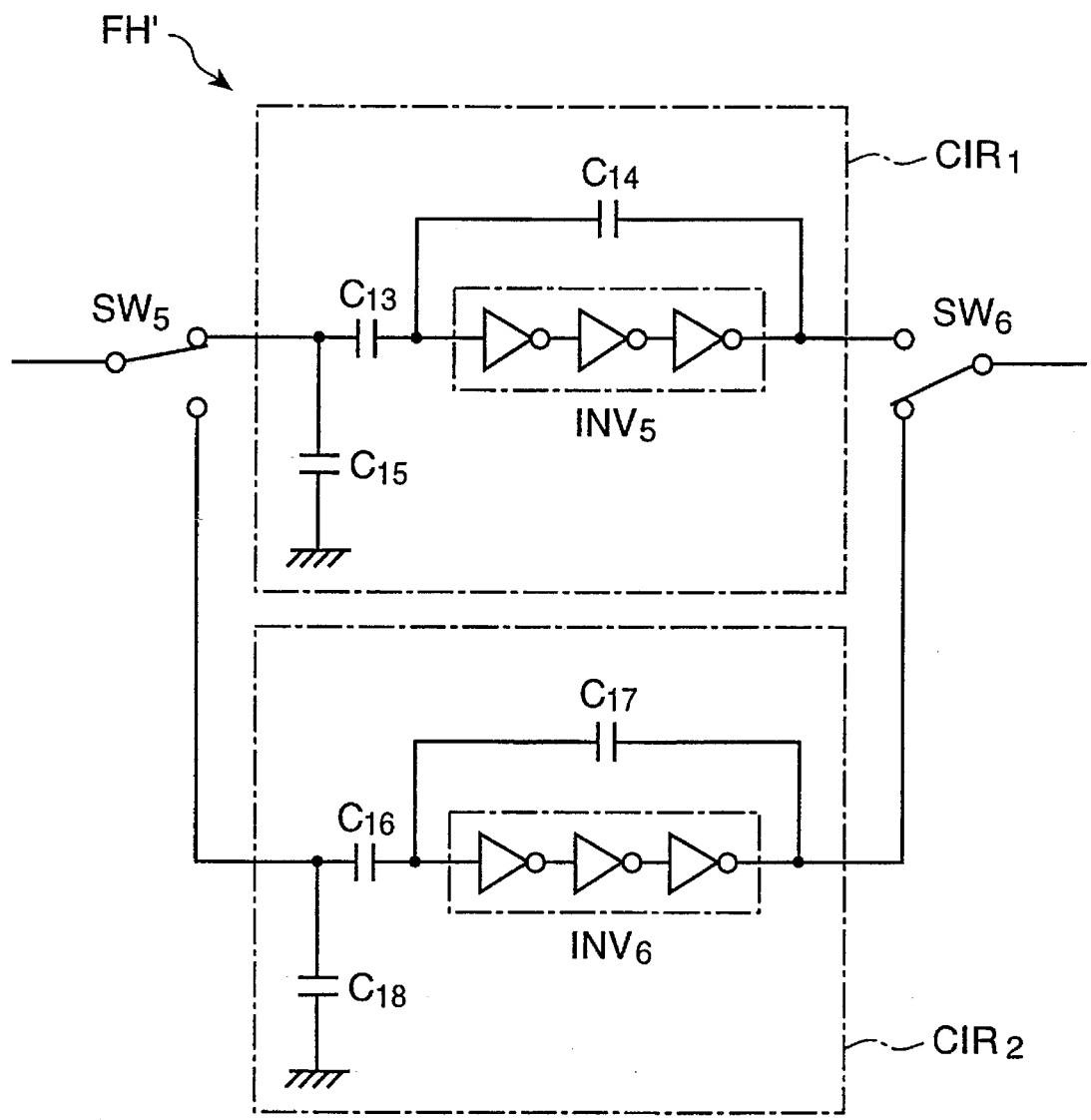
FIG. 28 is another leading holding portion.

Hereinafter, the second embodiment of the front portion of the holding circuit is shown. In FIG. 28, the front portion FH' has a circuit CIR1 including capacitance C13 and inverter INV5, serially connected, and an output of which is fed to the input through capacitance C14. Circuit CIR2 includes serially connected capacitance C16 and inverter INV6, an output of which is fed back to the input through capacitance C17. CIR1 and CIR2 are parallelly connected.

Switching means SW5 and SW6 are provided for selecting one of CIR1 and CIR2 at the input side and output side, respectively. SW5 and Sw6 are connected in the opposite positions. One of them performs amplifying and holding, the other performs the outputting of data, so sample/hold and output are simultaneously executed. Therefore, sample/hold and outputting can be performed in high speed.

Figure 29:
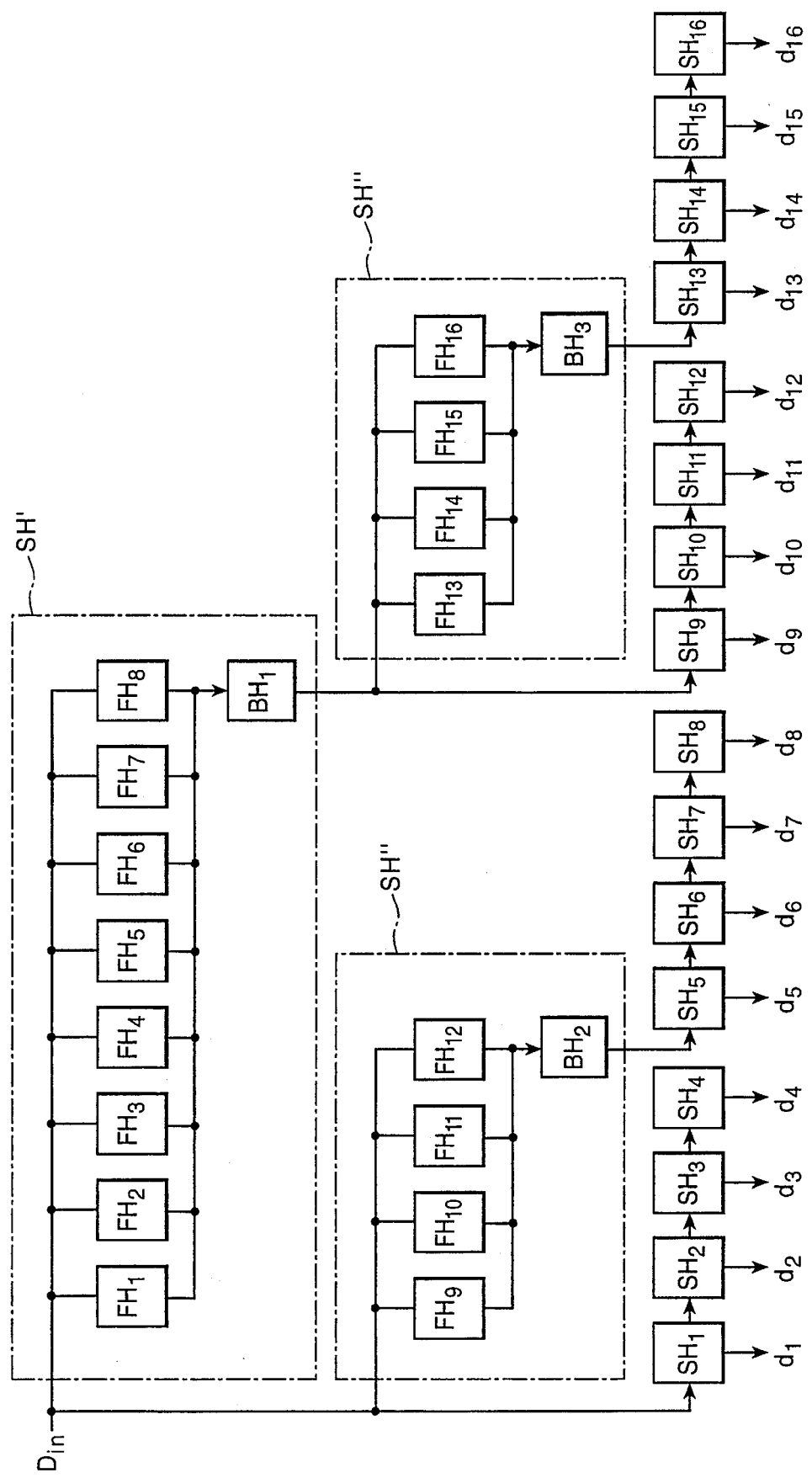
FIG. 29 is a variation of the circuit in FIG. 28.
Figure 30:
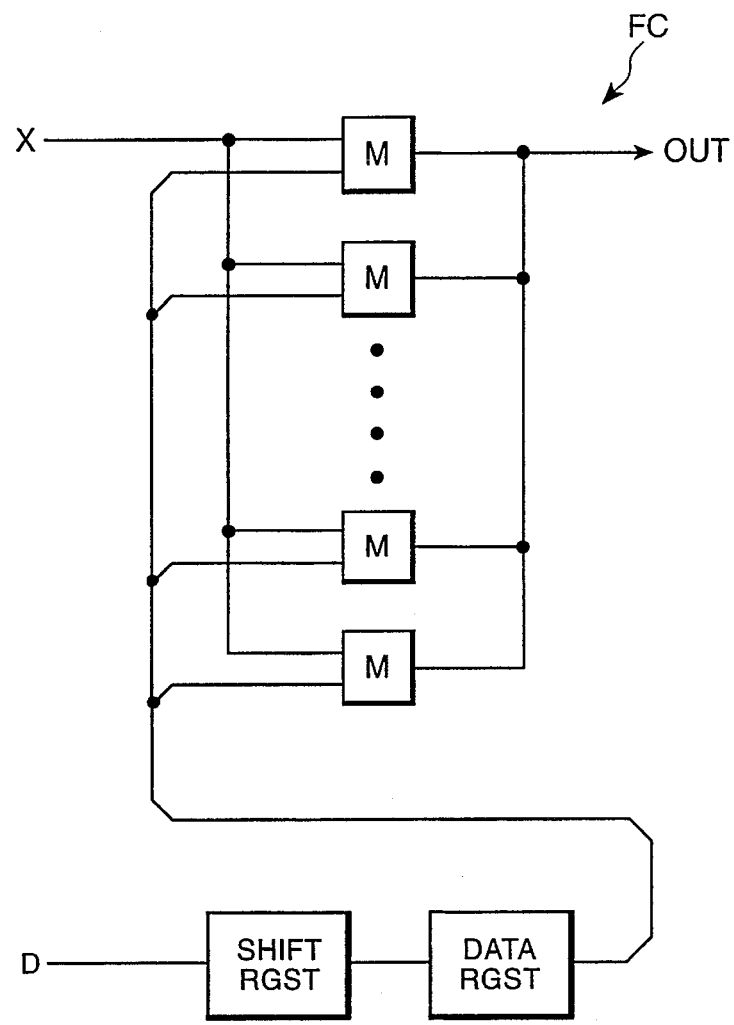
FIG. 30 is the fourth embodiment of the filter circuit.
Figure 31:
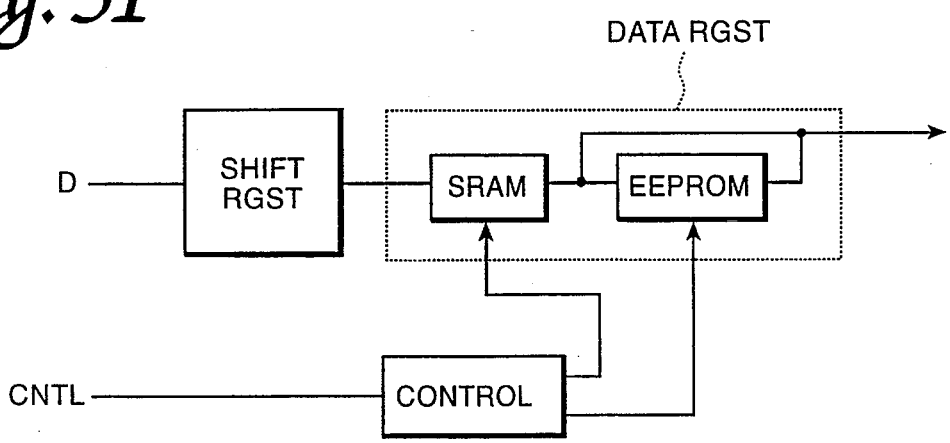
FIG. 31 shows a data register, shift register and a control portion of the filter circuit in FIG. 30.

FIG. 29 shows a variation of the whole circuit of FIG. 24. In the circuit of FIG. 29, SH1 to SH16 are divided into 4 portions, SH1 to SH4 directly receives input Din, and SH9 to SH12 receives Din through SH' similar to FIG. 27. Furthermore, Din is transferred to SH5–SH8 through SH11 with four stages of hold circuits. SH13 to SH16 receives Din through SH' and SH".

As mentioned above, a plurality of capacitances and inverters for level guarantee are parallelly provided. An input voltage is selectively transferred to one capacitance by a switching means. By selectively outputting the voltage held from one of the capacitances to a capacitance of the next stage. Then, the transmission error is minimized because of decreased transfer times. By a feed back system using operational amplifiers Amp1 and Amp2, an output accuracy is guaranteed and hold error is minimized.

The hold circuit which is used such as a filter circuit, can be similar to the one shown in FIG. 7 and 10.

As mentioned above, the hold circuit accurately holds a voltage signal due to an operational amplifier by a capacitance of two stages. The timing is classified into hold phase and transfer phase so that it has an effective result to control hold error to a minimum.

Figure 32:
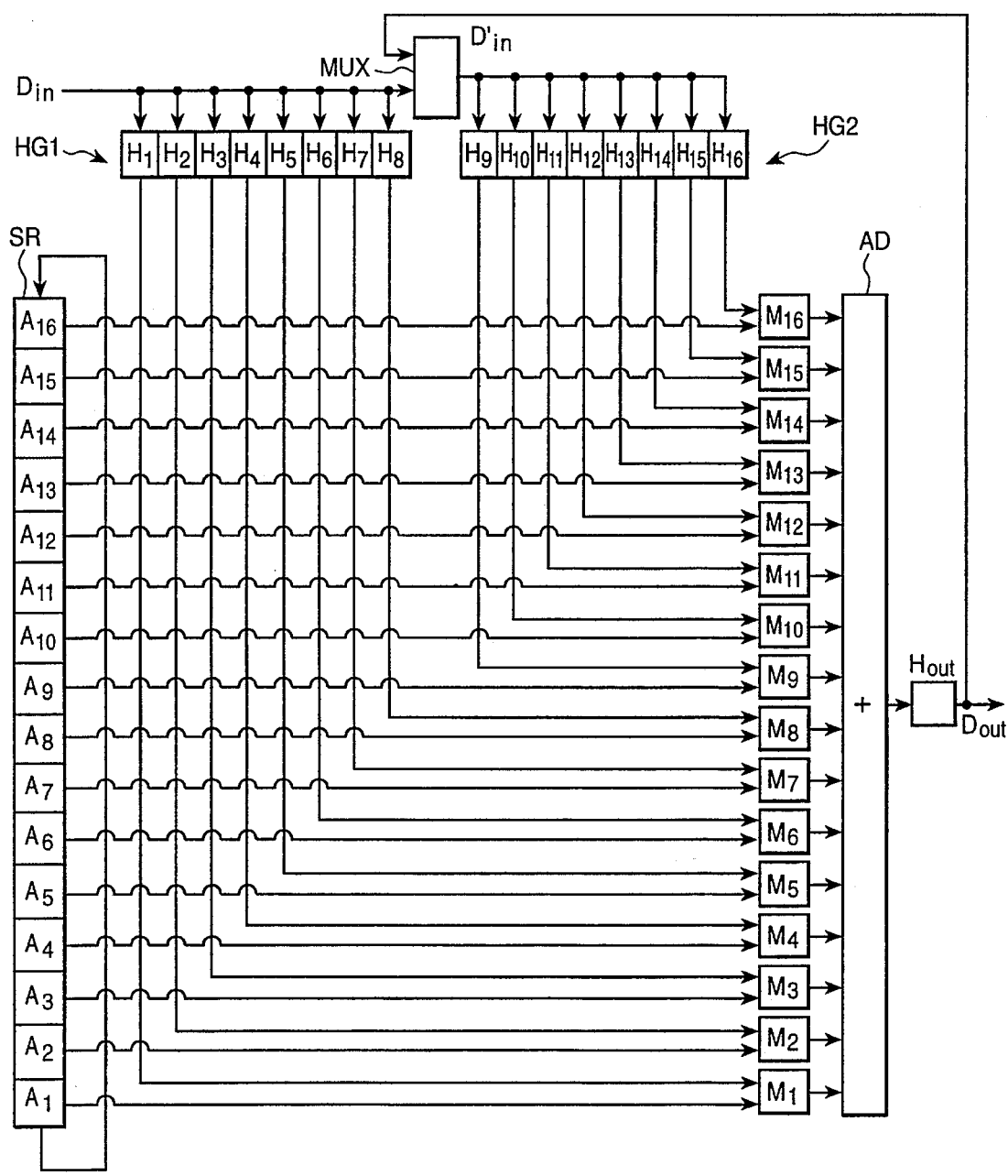
FIG. 32 illustrates a fifth embodiment of the filter circuit.

In FIG. 32, the sixth embodiment of a filter circuit has a plurality of hold circuits Hi to H16, and an output of each hold circuit is input to corresponding multiplication circuits M1 to M16. Furthermore, each data area A1 to A16 of shift register SR is connected to each multiplication circuit M1 to M16, and these data of data. area are used as multipliers corresponding to the data of the hold circuits.

Outputs of multiplication circuits M1 to M16 are added by addition circuit AD and the total summation is calculated.

When input data Din is input to hold circuits H1 to H16, sequential data of Din is held in H1 to H16 sequentially, and performance is repeated for holding the next sequential data from Hi. Then, without transferring data between hold circuits, all sequential data can be obtained in the predetermined timing.

After H1 to H16 are filled with sequential data of the first group, it is necessary to shift multipliers to data in each hold circuit for holding the next data. By inputting sequential data, a multiplier is shifted to the next multiplication circuit, and a multiplier of the final end multiplication is moved back to the first multiplication circuit.

By transferring between hold circuits in such a circuit a hold error is avoided.

Hold circuits H1 to H16 are divided into the first hold circuit group HG1 and the second hold circuit group HG2, and H1 to H8 and H9 to H16 correspond to HG1 and HG2, respectively.

Between HG1 and HG2, multi-plexer MUX is connected, and inputs of GH1 and GH2 are classified into the first input data Din and the second input data D' in.

An output of addition circuit AD is held at hold circuit Hout once and an output of Hout is fed back to multi-plexer MUX. MUX selectively inputs one of the first input data Din or output of Hout to HG2, which is defined as D'.

When Din is selected as D' a filter circuit executes an operation showing by the following formula and it becomes FIR type filter.

$$Y(t) = \sum_{i=0}^{15} a_i X(t-1) \tag{78}$$

Y(t) is an output, X(t) and ai are multipliers.

When an output of Hout is selected as D' a filter circuits executes an operation showing by the following formula. This is IIR type filter.

$$Y(t) = \sum_{i=0}^{7} aiX(t-1) + \sum_{i=0}^{7} biY(t-1) \tag{79}$$

Y(t) is an output, X(t) is an input and ai and i are multipliers.

The hold circuit in FIG. 32 can be similar to that of FIG. 8 and the multiplication circuit can be similar to that of FIG. 6.

Hereinafter, embodiments for a method for forming capacitances are described.

Figure 33:
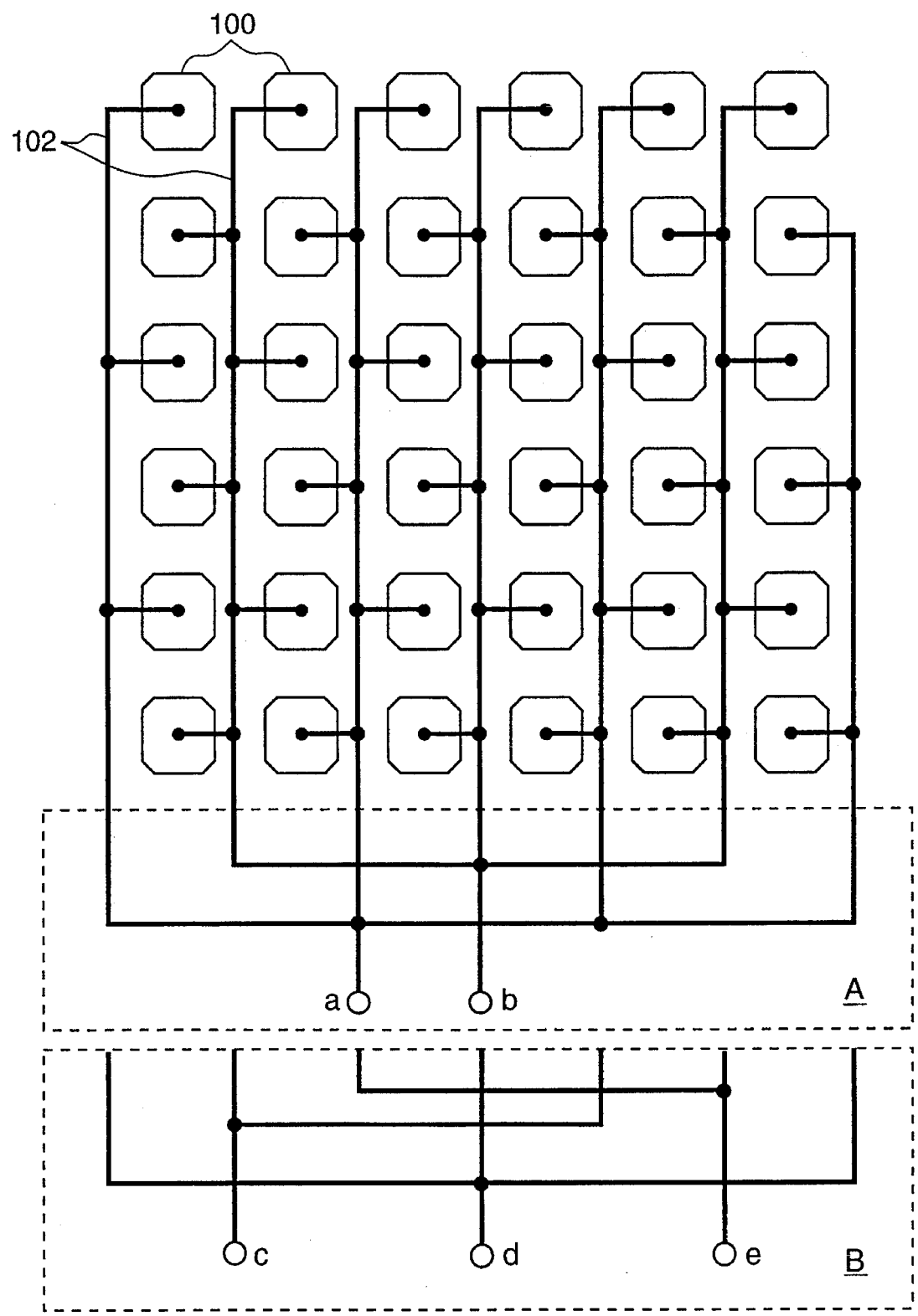
FIG. 33 is a circuit diagram showing the first embodiment of arrangement of capacitances in a LSI for the computational circuits.

FIG. 33 shows the first embodiment of circuit of capacitances on a LSI. In the circuit 56, unit capacitances 100 are arranged in a shape of a 6×6 square. The two-dimensional arrangement of one unit capacitance is a square with round corners.

Conductance lines 102 are extended along rows in the vertical direction of the square in the Figure. There are two sets of conductance lines for connecting capacitances of a first set and for connecting capacitances of a different set from the first set. The lines of different sets are provided along both sides of one row of the square. One line is connected to every other unit of the row different from the units the other line is connected to. Each set of conductance lines is connected to half of the unit capacitances.

In portion "A" of the area surrounded by broken line, each set of conductive lines are introduced to terminal a or b. The number of unit capacitances connected to one set of conductive lines is half of the total unit capacitances, so one terminal a or b is connected a capacitance with half of the total capacity of unit capacitances.

A rear portion "B" surrounded by a broken line shows another connection of conductance lines. Three terminals c, d and e are provided and each third of lines are connected to one terminal, a third of the total capacity is connected to one terminal.

FIG. 33 shows connections of one terminal of each of the capacitances. The wiring for the other terminal is similar to the above. When a common voltage is given to one terminal of a plurality of capacitances, these capacitances are connected to one terminal, independently from connections of other terminals.

In the embodiment in FIG. 33, the unit capacitance is connected so that the capacitance ratio of composite capacitance is 1:1. It is possible to connect so that the ratio is 12:24 or 9:27, for example. Another ratio such as 9:26 is also possible, by disconnecting some of unit capacitances.

The scattered distribution of unit capacitances improves the accuracy of relative capacities by minimizing influence of manufacturing deviation of capacitances.

Figure 34:
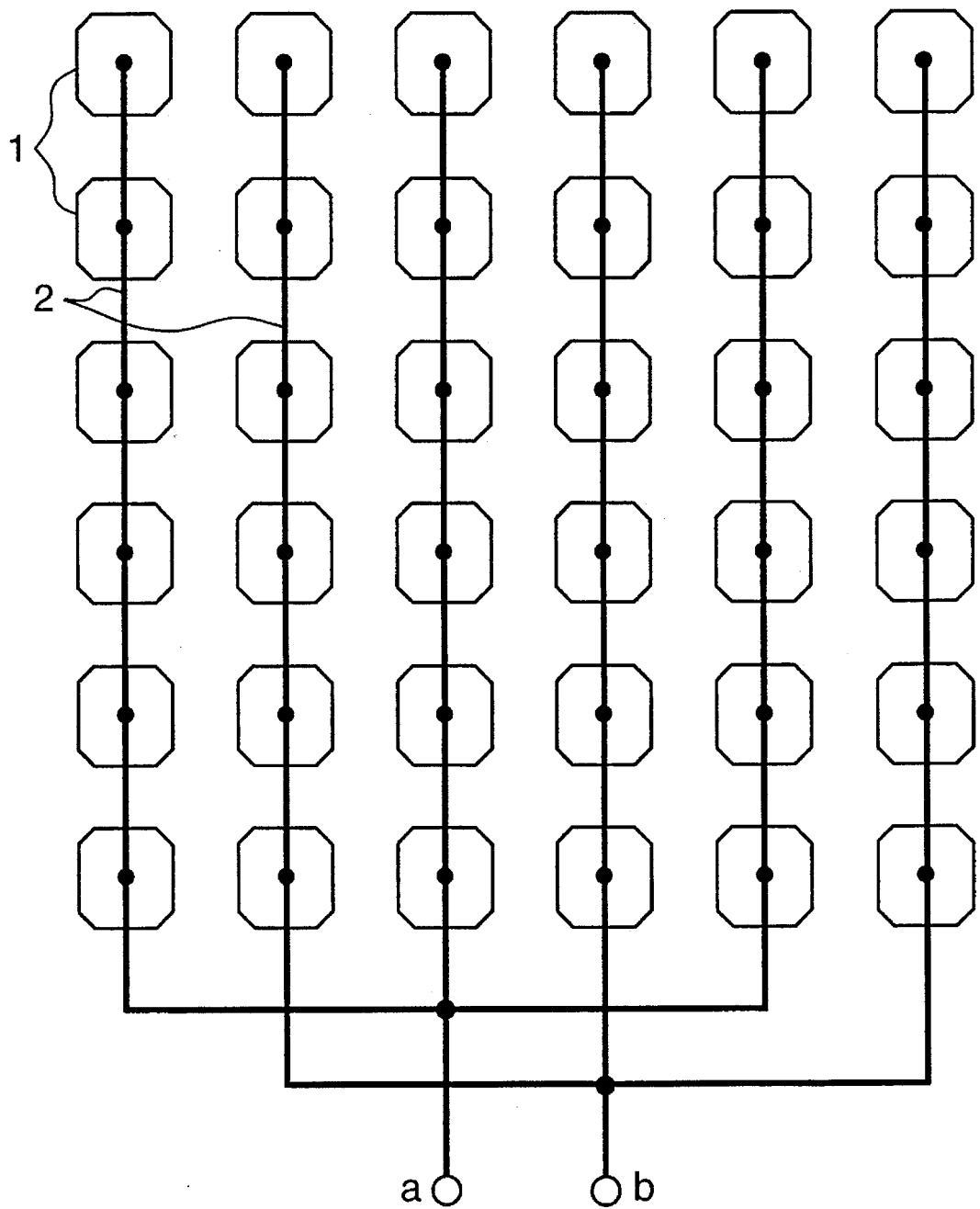
FIG. 34 is a second embodiment of the capacitance arrangement.

FIG. 34 shows a second embodiment of the capacitance on an LSI. In this embodiment, conductance lines extend along and over the rows of unit capacitance so that each line is connected to all of unit capacitances so that each line is connected to all of unit capacitances of one row. This connection is simpler than that in FIG. 33, and similar advantages of decreased deviation of relative capacity are obtained.

Figure 35:
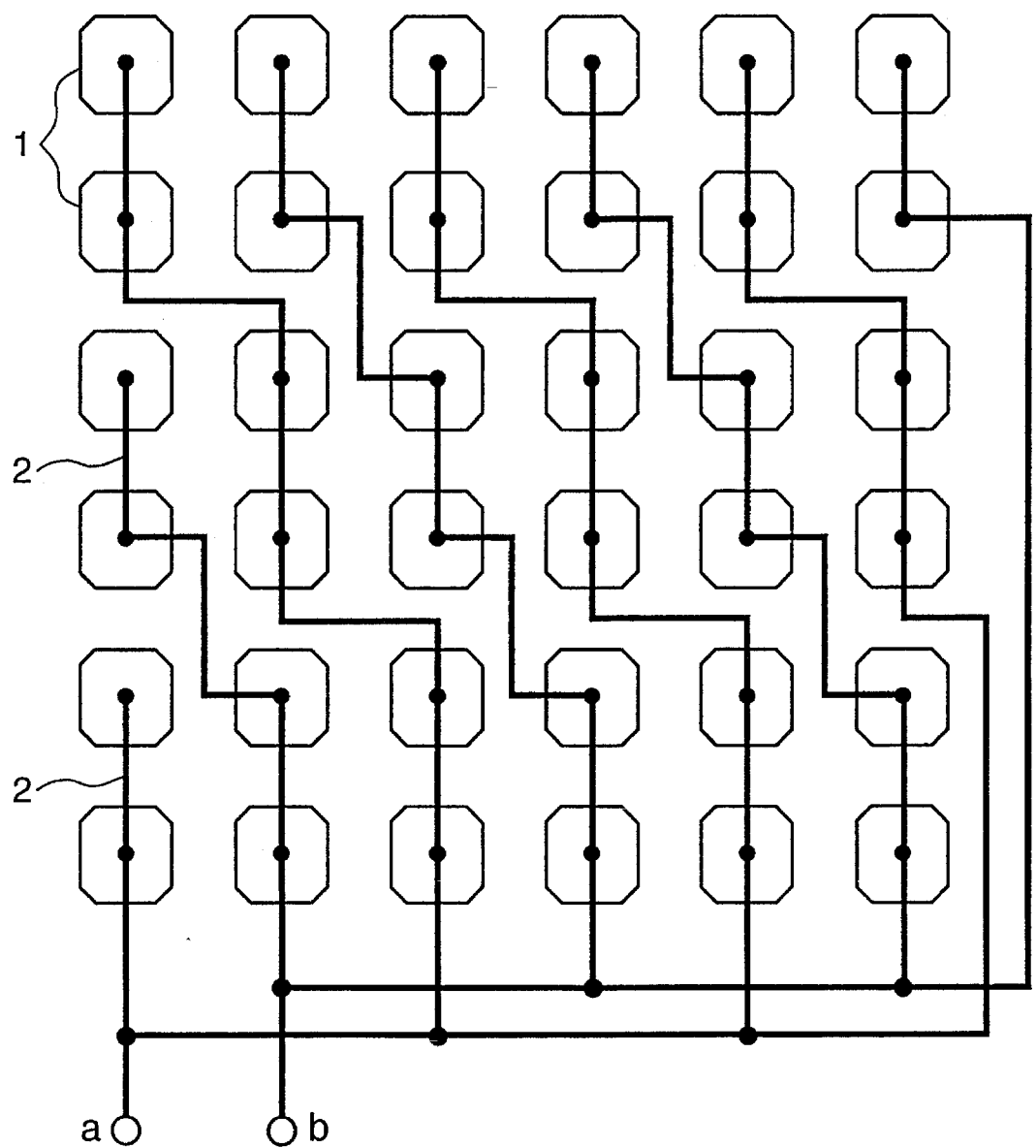
FIG. 35 is a third embodiment of the capacitance embodiment.

FIG. 35 shows the third embodiment of capacitance on a LSI. Unit capacitances of one row are classified into a plurality of pair of capacitances, each pair consists of adjacent two capacitances. Each pair is connected to a set of lines different from set of lines connected to adjacent pairs in both directions of rows and columns. By the scattering connection in FIG. 48, connections becomes more simple than the first embodiment and similar advantages of low deviation in capacity is obtained.

Figures 37, 38:
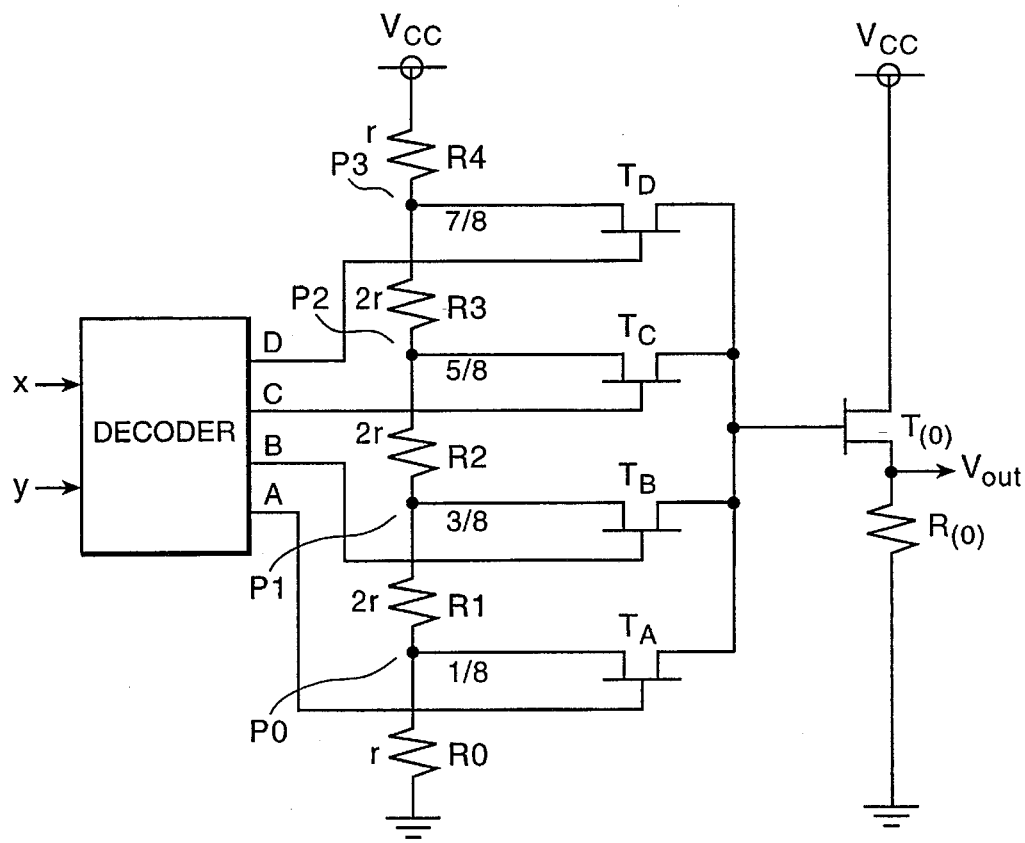
FIG. 37 shows a converter circuit for converting a binary number to a multi-valued number.
FIG. 38 is a diagram showing signal levels.

FIG. 37 is a circuit diagram of a converter circuit having a computational circuit for converting a binary number into multi-valued number of digit-4. Transistors TA, TB, TC and TD are provided parallelly connected, resistances R4, R3, R2, R1 and R0 connected to drains of the transistors. Sources of TD and TC are connected to power source Vcc through R3 and R4 and power source Vcc through R4, R3 and R2, respectively. A source of TA is connected to power source Vcc through R4, R3, R2 and R1. Here, the resistance values of R4 and R0 are equal and the resistance values of R3, R2 and R1 are twice as R4 or R0.

A voltage divider is defined by resistances R0 to R4 for generating voltages (⅞) Vcc between R3 and R4, (⅝) Vcc between R2 and R3, (⅜) Vcc between R1 and R2 and (⅛) Vcc between R0 and R1. The output points of the voltages are designated as P3, P2, P1 and P0 respectively. Only one of the voltages is introduced through the transistors to the output side.

When both x and y are "0", only signal A is output to make TA conductive. Then, a voltage of input P0 is output as Vout.

When x is "1" and y is "0", only signal B is output by high level and only TB is conductive. Then, a voltage of point P1 is output as Vout.

When x is "0" and V is "1", only signal C is output at a high level and only TC is conductive. Then, a voltage of point P2 is output as Vout.

When x and y are "1", only signal D is output at a high level and only TD is conductive. Then, a voltage of point P3 is output as Vout.

In the circuit, when signals A, B, C and D becomes "1", voltage Vout is shown by the following relationships:

Signal A: $0 < Vout < ¼Vcc$

Signal B: $¼Vcc < Vout < 2/4Vcc$

Signal C: $2/4Vcc < Vout < ¾Vcc$

Signal D: $¾Vcc < Vout < Vcc$

Then, it is possible to express binary 2 bits of data of 2 lines to a line with four values corresponding to a voltage level.

In FIG. 38, the relationship shown between signals x, y and signals A, B, C and D are shown as a table.

In a circuit of FIG. 41, V1 and V2 are input voltages, C1 and C2 are condensers, T1 is nMOS and T2 is pMOS transistor. If, C1=C2, the voltage V3 is shown by the following formula 80.

$$V3 = \frac{C1V1 + C2V2}{C1 + C2} = \frac{V1 + V2}{2} \tag{80}$$

Here, defining threshold voltage of T1 and T2 as VT, then signal x' is "1" in a case V3<VT and signal x' is "0" with switching characteristics in a case V3≧VT.

Next, a converter circuit for converting a multi-valued number to digit number is described. In FIG. 39, a voltage divider for (¼) Vcc and (¾) Vcc is provided for inputting the voltages to capacitive couplings. Each capacitive coupling receives one phase voltage and an input voltage Vin for adding them with equal weights to each other. The output from the capacitive couplings are VC, VB and VA, respectively.

The outputs VA, VB and VC are input to inverters for outputting A', B' and C', respectively. When a threshold value of each inverter is defined as ½ Vcc, the input voltages VA, VB and VC of the inverters are defined by the following formulas, according to formula 80.

$$VA = \frac{3/4Vcc + Vin}{2} \tag{81}$$

-continued $$VB = \frac{2/4Vcc + Vin}{2} \quad (82)$$

$$VC = \frac{1/4Vcc + Vin}{2} \quad (83)$$

All signals A', B' and C' are "1" in a case Vin<¼ Vcc, signal A' is "0" in a case Vin≧¼ Vcc, signals A' and B' are "0" in a case Vin≧¾ Vcc and all signals A' B' and C' are "0" in a case Vin≧¾ Vcc.

Here, an encoder receiving A' B' and C' arranges the signal level of y' and z' to be "0" in a case where all signals A', B' and C' are "1", signal level of y' to be "1" and of z' to be "0" in case where signal A' is "0", signal level y' to be "0" and of z" to be 1 in a case where signals A' and B' are "0", and signal level y' and z' to be "1" in a case all signals A', B' and C' are "0".

Then, it is possible to convert 2 bits of data of digit-f number into binary.

FIG. 40 show a relationship between signal A', B' and C' and signals y' and z'.

Hereinafter, an embodiment of a circuit between LSI in a board having binary to multi-valued or multi-valued to binary interface circuit in an input and output interface of binary logic LSI. Then, it is possible to reduce a number of pins on the LSI circuit.

Figure 36:
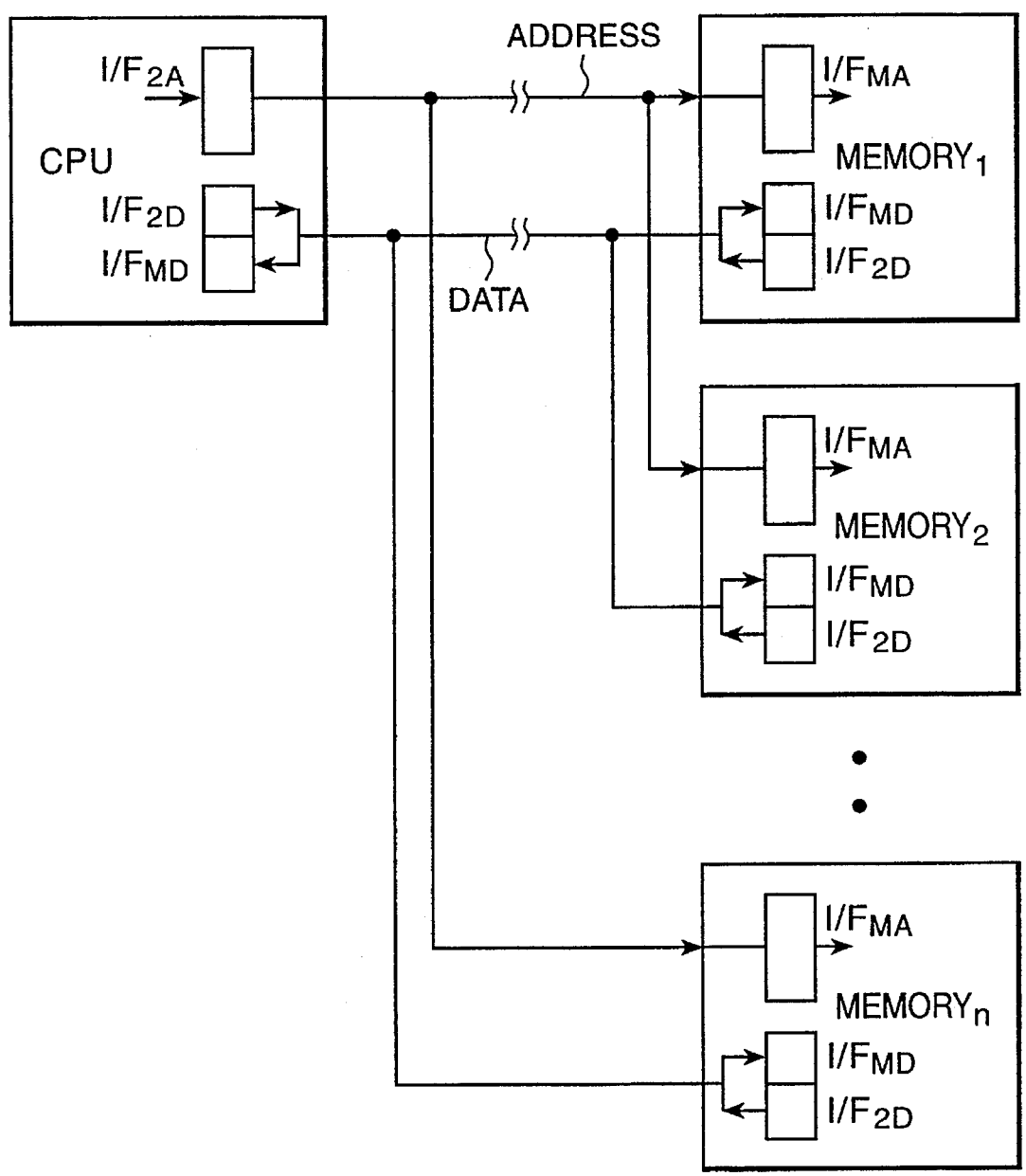
FIG. 36 shows one embodiment of an architecture of a LSI using the above computational circuits.

In FIG. 36, I/F2A is a binary multi-valued interface Circuit of an address signal. I/FMA is a multi-valued binary interface circuit of an address signal, I/F2D is a binary multi-valued inter face circuit of a data signal and I/FMD is a multi-valued binary interface circuit of a data signal. Insides of the CPU chip and a memory chip are binary logical circuit. A binary address signal used in the CPU is converted to multi-valued and output. The output signal is converted into binary signal through I/FMA of memory 1 and stored at memory 1.

A binary data used in CPU is converted to a multi-valued through a binary/multi-valued I/F2A and output. An output data is converted into a binary data through multi-valued/binary converter I/FMA of memory 1 chip and store at memory 1.

In a case where processing a data stored to memory 1 by a binary data by the CPU, binary multi-valued converting is performed through I/F2D of memory 1, and the data is processed binary multi-valued converting by the CPU through I/FMD of the CPU.

What is claimed is:

1. A computational circuit comprising:

a first capacitive coupling including a plurality of first capacitors which are operatively connected to a plurality of first analog input voltages, said first capacitors being commonly connected to a first output terminal;

a first inverter having an first input and a first output, said first input of said first inverter being operatively connected to said first output terminal;

a connecting capacitance operatively connected to said first output of said first inverter;

a second inverter having a second input and a second output, said second input being operatively connected to said first output of said first inverter through said connecting capacitance;

a first feed back capacitance operatively connecting said first output of said first inverter to said input thereof;

a second feed back capacitance operatively connecting said second output of said second inverter to said input thereof; and a plurality of additional capacitances, wherein a first additional capacitance is operatively connected between ground and said first capacitive coupling and a second additional capacitance is operatively connected between said ground and said connecting capacitance, wherein capacitance values of said first and said second additional capacitances are selected such that a closed-loop gain of said first inverter and a closed-loop gain of said second inverters are substantially equal.

2. A computational circuit comprising:

a first capacitive coupling including a plurality of first capacitors which are operatively connected to a plurality of analog input voltages, said first capacitors being commonly connected to an output terminal;

a first inverter having an first input and a first output, said first input of said first inverter being operatively connected to said output terminal;

a connecting capacitance operatively connected to said first output of said first inverter;

a second inverter having a second input and a second output, said second input being operatively connected to said first output of said first inverter through said connecting capacitance;

a first feed back capacitance operatively connecting said first output of said first inverter to said input thereof;

a second feed back capacitance operatively connecting said second output of said second inverter to said input thereof;

a plurality of additional capacitances, wherein a first additions, capacitance is operatively connected between ground and said first capacitive coupling;

a second capacitive coupling connected to said input of said second inverter in parallel with said connecting capacitance, said second capacitive coupling having capacitances equivalent to capacitances of said first capacitive coupling; and a plurality of switching circuits, wherein one switching circuit is associated with each capacitances in said first and said second capacitive couplings such that said switching circuits alternatively connects each analog input voltage to a capacitor in one of said first capacitive coupling and said second capacitive coupling.

3. A computational circuit as claimed in claim 1, further comprising:

a second capacitive coupling including a plurality of second capacitors which are operatively connected to said plurality of second analog input voltages, said second capacitive coupling being commonly connected to a second output terminal the third inverter having an third input and a third output, said third input being connected to said second output terminal;

a second connecting capacitance operatively connecting said third output of said third inverter to said second input of said second inverter; and the third feed back capacitance operatively connecting said third output of said third inverter to said input of said third inverter;

wherein said plurality of additional capacitances includes a third additional capacitance which is operatively connected between ground and said second capacitive coupling, wherein a capacitance of said third additional capacitance is selected such that a closed-loop gain of said third inverter is substantially equal to said closed-loop gain of said first and said second inverter.

* * * * *

UNITED STATES PATENT AND TRADEMARK OFFICE
CERTIFICATE OF CORRECTION

PATENT NO. : 5,617,053
DATED : April 1, 1997
INVENTOR(S) : SHOU et al.

It is certified that error appears in the above-identified patent and that said Letters Patent is hereby corrected as shown below:

ON THE TITLE PAGE:

Item [30]  Foreign Application Priority Data

| Jun. 17, 1993 | [JP] | Japan | 5-171041 |
| Jun. 18, 1993 | [JP] | Japan | 5-172551 |
| Jun. 18, 1993 | [JP] | Japan | 5-172552 |
| Jun. 19, 1993 | [JP] | Japan | 5-174713 |
| Jun. 24, 1993 | [JP] | Japan | 5-177362 |
| Jun. 30, 1993 | [JP] | Japan | 5-187215 |
| Sep. 20, 1993 | [JP] | Japan | 5-256355 |
| Sep. 20, 1993 | [JP] | Japan | 5-256359 |
| Sep. 20, 1993 | [JP] | Japan | 2-256367 |
| Sep. 20, 1993 | [JP] | Japan | 2-256518 |
| Sep. 20, 1993 | [JP] | Japan | 2-256557 |
| Sep. 20, 1993 | [JP] | Japan | 2-256558 |
| Apr. 1, 1994 | [JP] | Japan | 6-087720 |

UNITED STATES PATENT AND TRADEMARK OFFICE
CERTIFICATE OF CORRECTION

PATENT NO.   : 5,617,053
DATED        : April 1, 1997
INVENTOR(S)  : SHOU et al.

It is certified that error appears in the above-identified patent and that said Letters Patent is hereby corrected as shown below:

Should Read:   [30]   Foreign Application Priority Data

```
Sep. 20, 1993   [JP]   Japan . . . . . . . . . 5-256385
Dec. 28, 1993   [JP]   Japan . . . . . . . . . 5-350856
```

Signed and Sealed this

Second Day of January, 2001

Attest:

Attesting Officer

Q. TODD DICKINSON

Commissioner of Patents and Trademarks